(12) United States Patent
Yu et al.

(10) Patent No.: US 10,957,672 B2
(45) Date of Patent: Mar. 23, 2021

(54) PACKAGE STRUCTURE AND METHOD OF MANUFACTURING THE SAME

(71) Applicant: Taiwan Semiconductor Manufacturing Co., Ltd., Hsinchu (TW)

(72) Inventors: Chi-Yang Yu, Taoyuan (TW); Chin-Liang Chen, Kaohsiung (TW); Chien-Hsun Lee, Hsin-chu (TW); Kuan-Lin Ho, Hsinchu (TW); Yu-Min Liang, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/835,466

(22) Filed: Dec. 8, 2017

(65) Prior Publication Data

US 2019/0148340 A1    May 16, 2019

Related U.S. Application Data

(60) Provisional application No. 62/584,914, filed on Nov. 13, 2017.

(51) Int. Cl.
*H01L 25/065* (2006.01)
*H01L 23/31* (2006.01)
(Continued)

(52) U.S. Cl.
CPC .......... *H01L 25/0655* (2013.01); *H01L 21/56* (2013.01); *H01L 21/563* (2013.01); *H01L 21/565* (2013.01); *H01L 21/568* (2013.01); *H01L 23/295* (2013.01); *H01L 23/3135* (2013.01); *H01L 23/3142* (2013.01); *H01L 23/5386* (2013.01); *H01L 24/11* (2013.01);
(Continued)

(58) Field of Classification Search
CPC ............ H01L 23/5381; H01L 23/3121; H01L 23/3185; H01L 23/3171; H01L 23/3135; H01L 23/5221; H01L 23/485; H01L 25/0655; H01L 24/16; H01L 24/96; H01L 2224/96; H01L 25/18; H01L 23/5389; H01L 23/3107; H01L 23/3125; H01L 23/3142; H01L 21/56–565; H01L 25/072; H01L 2224/24137
See application file for complete search history.

(56) References Cited

U.S. PATENT DOCUMENTS 5,510,956 A * 4/1996 Suzuki ................. H01L 21/563
174/16.3
5,866,953 A * 2/1999 Akram ................. H01L 21/563
257/687
(Continued)

*Primary Examiner* — Sophia T Nguyen
(74) *Attorney, Agent, or Firm* — JCIPRNET

(57) ABSTRACT

A package structure and a method of forming the same are provided. The package structure includes a first die, a second die, a first encapsulant, a second encapsulant, and a plurality of conductive terminals. The first encapsulant is at least disposed between the first die and the second die, and on the second die. The second encapsulant is aside the first die and the second die. The conductive terminals are electrically connected to the first die and the second die through a redistribution layer (RDL) structure. An interface is existed between the first encapsulant and the second encapsulant.

20 Claims, 21 Drawing Sheets

(51) Int. Cl.
*H01L 21/56* (2006.01)
*H01L 23/538* (2006.01)
*H01L 23/00* (2006.01)
*H01L 23/29* (2006.01)
*H01L 25/00* (2006.01)
*H01L 21/66* (2006.01)

(52) U.S. Cl.
CPC ............. *H01L 24/16* (2013.01); *H01L 24/19* (2013.01); *H01L 24/20* (2013.01); *H01L 24/24* (2013.01); *H01L 24/82* (2013.01); *H01L 25/50* (2013.01); *H01L 22/32* (2013.01); *H01L 23/3128* (2013.01); *H01L 2224/11002* (2013.01); *H01L 2224/13016* (2013.01); *H01L 2224/13025* (2013.01); *H01L 2224/13144* (2013.01); *H01L 2224/13147* (2013.01); *H01L 2224/16225* (2013.01); *H01L 2224/19* (2013.01); *H01L 2224/215* (2013.01); *H01L 2224/24137* (2013.01); *H01L 2224/82005* (2013.01); *H01L 2224/82101* (2013.01); *H01L 2924/1203* (2013.01); *H01L 2924/1304* (2013.01); *H01L 2924/1433* (2013.01)

(56) References Cited

U.S. PATENT DOCUMENTS

| | | | | |
|---|---|---|---|---|
| 6,338,980 | B1* | 1/2002 | Satoh | H01L 21/561 257/E21.508 |
| 6,353,267 | B1* | 3/2002 | Ohuchi | H01L 21/6836 257/690 |
| 6,972,964 | B2* | 12/2005 | Ho | H01L 23/5389 257/E23.178 |
| 7,011,988 | B2* | 3/2006 | Forcier | B81C 1/0023 257/E21.514 |
| 7,217,999 | B1* | 5/2007 | Honda | H01L 21/486 257/712 |
| 7,382,620 | B2* | 6/2008 | Khanna | H01L 23/42 165/185 |
| 7,838,424 | B2* | 11/2010 | Karta | H01L 21/561 257/730 |
| 8,598,695 | B2* | 12/2013 | Oganesian | H01L 23/481 257/686 |
| 8,829,676 | B2* | 9/2014 | Yu | H01L 21/568 257/737 |
| 9,000,584 | B2 | 4/2015 | Lin et al. | |
| 9,013,037 | B2* | 4/2015 | Jin | H01L 23/3114 257/737 |
| 9,048,222 | B2 | 6/2015 | Hung et al. | |
| 9,048,233 | B2 | 6/2015 | Wu et al. | |
| 9,064,874 | B2 | 6/2015 | Edelstein et al. | |
| 9,111,949 | B2* | 8/2015 | Yu | H01L 21/561 |
| 9,171,797 | B2* | 10/2015 | Lin | H01L 21/6835 |
| 9,263,511 | B2 | 2/2016 | Yu et al. | |
| 9,281,254 | B2 | 3/2016 | Yu et al. | |
| 9,293,369 | B2* | 3/2016 | Wu | H01L 24/97 |
| 9,368,460 | B2 | 6/2016 | Yu et al. | |
| 9,372,206 | B2 | 6/2016 | Wu et al. | |
| 9,478,504 | B1* | 10/2016 | Shen | H01L 23/49838 |
| 9,496,189 | B2 | 11/2016 | Yu et al. | |
| 9,543,242 | B1* | 1/2017 | Kelly | H01L 23/49816 |
| 9,607,919 | B2* | 3/2017 | Lee | H01L 23/3128 |
| 9,620,430 | B2* | 4/2017 | Lu | H01L 23/3135 |
| 9,633,869 | B2* | 4/2017 | Chiu | H01L 23/49816 |
| 9,793,230 | B1* | 10/2017 | Yu | H01L 24/20 |
| 9,865,552 | B2* | 1/2018 | Ryu | H01L 23/562 |
| 10,014,218 | B1* | 7/2018 | Shih | H01L 24/17 |
| 10,163,825 | B1* | 12/2018 | Liao | H01L 23/66 |
| 10,276,536 | B2* | 4/2019 | Pei | H01L 24/19 |
| 2003/0080437 | A1* | 5/2003 | Gonzalez | H01L 21/563 257/778 |
| 2004/0238934 | A1* | 12/2004 | Warner | H01L 23/49861 257/686 |
| 2006/0272150 | A1* | 12/2006 | Eguchi | H05K 3/284 29/841 |
| 2008/0079163 | A1* | 4/2008 | Kurita | H01L 21/6835 257/759 |
| 2008/0099912 | A1* | 5/2008 | Wu | H01L 23/142 257/737 |
| 2008/0160751 | A1* | 7/2008 | Pang | H01L 24/81 438/612 |
| 2008/0265439 | A1* | 10/2008 | Honda | C09J 163/00 257/782 |
| 2009/0140442 | A1* | 6/2009 | Lin | H01L 25/50 257/778 |
| 2009/0223043 | A1* | 9/2009 | Hsu | G01R 1/07378 29/830 |
| 2009/0243064 | A1* | 10/2009 | Camacho | H01L 23/3121 257/680 |
| 2009/0309238 | A1* | 12/2009 | Loke | H01L 21/563 257/778 |
| 2010/0109169 | A1* | 5/2010 | Kolan | H01L 21/486 257/787 |
| 2010/0248427 | A1* | 9/2010 | Wu | H01L 21/561 438/118 |
| 2010/0308474 | A1* | 12/2010 | Shibuya | H01L 21/486 257/778 |
| 2011/0115070 | A1* | 5/2011 | Lim | H01L 21/563 257/698 |
| 2011/0121442 | A1* | 5/2011 | Shen | H01L 21/561 257/686 |
| 2011/0147945 | A1* | 6/2011 | Yoshida | H01L 21/561 257/774 |
| 2012/0139097 | A1* | 6/2012 | Jin | H01L 21/561 257/712 |
| 2012/0193779 | A1* | 8/2012 | Lee | H01L 23/3128 257/737 |
| 2012/0228762 | A1* | 9/2012 | Fukuda | H01L 21/563 257/737 |
| 2012/0235305 | A1* | 9/2012 | Kim | H01L 23/3135 257/774 |
| 2012/0282735 | A1* | 11/2012 | Ahn | H01L 21/76898 438/109 |
| 2013/0082399 | A1* | 4/2013 | Kim | H01L 24/19 257/774 |
| 2013/0154086 | A1* | 6/2013 | Yu | H01L 23/49816 257/734 |
| 2013/0168848 | A1* | 7/2013 | Lin | H01L 24/19 257/737 |
| 2013/0175706 | A1* | 7/2013 | Choi | H01L 24/97 257/777 |
| 2013/0183799 | A1* | 7/2013 | Sasaki | H01L 21/6835 438/118 |
| 2013/0187258 | A1* | 7/2013 | Lu | H01L 23/3135 257/621 |
| 2013/0187270 | A1* | 7/2013 | Yu | H01L 25/50 257/737 |
| 2013/0187292 | A1* | 7/2013 | Semmelmeyer | H01L 25/0652 257/777 |
| 2014/0131856 | A1* | 5/2014 | Do | H01L 21/481 257/737 |
| 2014/0203429 | A1* | 7/2014 | Yu | H01L 21/78 257/737 |
| 2014/0213017 | A1* | 7/2014 | Kim | H01L 21/78 438/107 |
| 2014/0246227 | A1* | 9/2014 | Lin | H01L 21/4857 174/266 |
| 2014/0252579 | A1* | 9/2014 | Chang | H01L 23/49838 257/676 |
| 2014/0312489 | A1* | 10/2014 | Im | H01L 23/3128 257/737 |
| 2015/0093856 | A1* | 4/2015 | Liu | H01L 23/24 438/107 |
| 2015/0102468 | A1* | 4/2015 | Kang | H01L 24/97 257/621 |
| 2015/0108634 | A1* | 4/2015 | Liu | H01L 24/13 257/737 |
| 2015/0125994 | A1* | 5/2015 | Lin | H01L 21/563 438/107 |

(56) References Cited

U.S. PATENT DOCUMENTS

| | | | |
|---|---|---|---|
| 2015/0130083 A1* | 5/2015 | Park | H01L 25/0657 257/777 |
| 2015/0214074 A1* | 7/2015 | Liu | H01L 23/24 257/692 |
| 2015/0221611 A1* | 8/2015 | Jeng | H01L 25/0655 257/770 |
| 2015/0255416 A1* | 9/2015 | Kim | H01L 23/3157 257/773 |
| 2015/0255426 A1* | 9/2015 | Son | H01L 21/6835 438/107 |
| 2015/0262972 A1* | 9/2015 | Katkar | H01L 21/561 257/48 |
| 2015/0318262 A1* | 11/2015 | Gu | H01L 23/49811 257/738 |
| 2015/0364436 A1* | 12/2015 | Yu | H01L 24/11 438/614 |
| 2015/0371970 A1* | 12/2015 | Sakurada | H01L 24/97 257/737 |
| 2016/0057863 A1* | 2/2016 | Kyozuka | H01L 21/486 361/764 |
| 2016/0071744 A1* | 3/2016 | Liu | H01L 23/24 438/107 |
| 2016/0071820 A1* | 3/2016 | Yu | H01L 24/19 257/737 |
| 2016/0071829 A1* | 3/2016 | Yu | H01L 24/24 257/773 |
| 2016/0093580 A1* | 3/2016 | Scanlan | H01L 24/96 257/737 |
| 2016/0163650 A1* | 6/2016 | Gao | H01L 23/49827 257/773 |
| 2016/0172329 A1* | 6/2016 | Chang | H01L 23/3135 257/737 |
| 2016/0181190 A1* | 6/2016 | Fukasawa | H01L 21/563 257/774 |
| 2016/0190405 A1* | 6/2016 | Yamada | H01L 33/54 257/88 |
| 2016/0204073 A1* | 7/2016 | Beak | H01L 23/295 455/418 |
| 2016/0218082 A1* | 7/2016 | Lee | H01L 24/19 |
| 2016/0307870 A1* | 10/2016 | Kelly | H01L 21/6835 |
| 2016/0315071 A1* | 10/2016 | Zhai | H01L 24/19 |
| 2016/0329304 A1* | 11/2016 | Hatakeyama | H01L 24/97 |
| 2016/0343592 A1* | 11/2016 | Costa | H01L 23/3135 |
| 2016/0365319 A1* | 12/2016 | Ryu | H01L 23/562 |
| 2016/0374194 A1* | 12/2016 | Miki | H01L 23/5389 |
| 2016/0380324 A1* | 12/2016 | Wu | H01P 3/026 333/1 |
| 2017/0005071 A1* | 1/2017 | Wei | H01L 21/486 |
| 2017/0005072 A1* | 1/2017 | Wei | H01L 25/0652 |
| 2017/0103943 A1* | 4/2017 | Hu | H01L 23/49838 |
| 2017/0103945 A1* | 4/2017 | Kobayashi | H01L 24/16 |
| 2017/0110425 A1* | 4/2017 | Huang | H01L 24/19 |
| 2017/0213809 A1* | 7/2017 | Lu | H01L 23/3135 |
| 2017/0221819 A1* | 8/2017 | Chu | H01L 21/4853 |
| 2017/0229321 A1* | 8/2017 | Marion | H01L 23/3171 |
| 2017/0243857 A1* | 8/2017 | Hwang | H01L 25/0655 |
| 2017/0263589 A1* | 9/2017 | Chang Chien | H01L 21/565 |
| 2017/0294422 A1* | 10/2017 | Solimando | H01L 25/105 |
| 2017/0365581 A1* | 12/2017 | Yu | H01L 25/0655 |
| 2018/0005916 A1* | 1/2018 | Chen | H01L 23/3675 |
| 2018/0053746 A1* | 2/2018 | Yu | H01L 24/19 |
| 2018/0061812 A1* | 3/2018 | Lee | H01L 25/50 |
| 2018/0061815 A1* | 3/2018 | Fang | H01L 24/19 |
| 2018/0130749 A1* | 5/2018 | Tsai | H01L 21/4853 |
| 2018/0138101 A1* | 5/2018 | Yu | H01L 21/563 |
| 2018/0138151 A1* | 5/2018 | Shih | H01L 24/94 |
| 2018/0166420 A1* | 6/2018 | Park | H01L 25/0657 |
| 2018/0174954 A1* | 6/2018 | Lu | H01L 23/49894 |
| 2018/0190560 A1* | 7/2018 | Li | H01L 23/3135 |
| 2018/0204780 A1* | 7/2018 | Chiu | H01L 21/31053 |
| 2018/0211929 A1* | 7/2018 | Bae | H01L 23/49816 |
| 2018/0226333 A1* | 8/2018 | Shih | H01L 23/49838 |
| 2018/0269164 A1* | 9/2018 | Lin | H01L 23/13 |
| 2018/0286704 A1* | 10/2018 | Nofen | H01L 21/563 |
| 2018/0286835 A1* | 10/2018 | Nah | H01L 25/50 |
| 2018/0366436 A1* | 12/2018 | Wang | H01L 25/0652 |
| 2019/0006257 A1* | 1/2019 | Hsu | H01L 23/3135 |
| 2019/0006315 A1* | 1/2019 | Hsu | H01L 25/0652 |
| 2019/0013289 A1* | 1/2019 | Fang | H01L 24/20 |
| 2019/0067104 A1* | 2/2019 | Huang | H01L 21/76898 |
| 2019/0067157 A1* | 2/2019 | Lin | H01L 25/0652 |
| 2019/0096816 A1* | 3/2019 | Ho | H01L 21/568 |
| 2019/0109117 A1* | 4/2019 | Fang | H01L 25/0655 |
| 2019/0139845 A1* | 5/2019 | Lin | H01L 23/5385 |
| 2019/0139847 A1* | 5/2019 | Wang | H01L 24/20 |
| 2019/0148329 A1* | 5/2019 | Ting | H01L 21/6835 257/774 |
| 2019/0148340 A1* | 5/2019 | Yu | H01L 21/56 257/737 |
| 2019/0181021 A1* | 6/2019 | Wang | H01L 24/06 |
| 2019/0237412 A1* | 8/2019 | Lee | H01L 23/5386 |
| 2019/0279881 A1* | 9/2019 | Do | H01L 21/561 |
| 2019/0279938 A1* | 9/2019 | Mehta | H01L 25/0655 |

* cited by examiner

PACKAGE STRUCTURE AND METHOD OF MANUFACTURING THE SAME

CROSS-REFERENCE TO RELATED APPLICATION

This application claims the priority benefit of U.S. provisional application Ser. No. 62/584,914, filed on Nov. 13, 2017. The entirety of the above-mentioned patent application is hereby incorporated by reference herein and made a part of this specification.

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also require smaller packages that utilize less area than previous packages. Some smaller types of packages for semiconductor components include quad flat packages (QFPs), pin grid array (PGA) packages, ball grid array (BGA) packages, and so on.

Currently, integrated fan-out packages are becoming increasingly popular for their compactness.

DETAILED DESCRIPTION

Figure 1A:
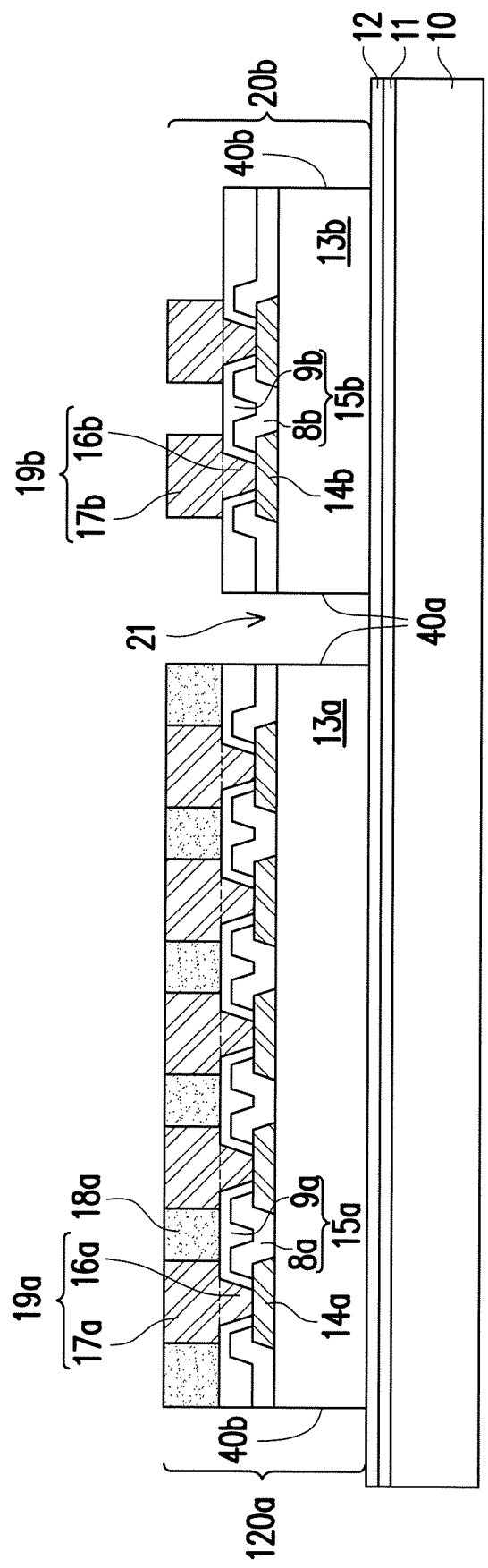
FIG. 1A to FIG. 1F are schematic cross-sectional views illustrating a method of forming a package structure according to a first embodiment of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "above", "upper" and the like, may be used herein for ease of description to describe one element or feature's relationship to another element(s) or feature(s) as illustrated in the FIG. The spatially relative terms are intended to encompass different orientations of the device in use or operation in addition to the orientation depicted in the FIGS. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1F are schematic cross-sectional views illustrating a forming method of a package structure according to a first embodiment of the disclosure.

Referring to FIG. 1A, a carrier 10 is provided. The carrier 10 may be a glass carrier, a ceramic carrier, or the like. In some embodiments, the carrier 10 has a de-bonding layer 11 formed thereon. The de-bonding layer 11 is formed by, for example, a spin coating method. In some embodiments, the de-bonding layer 11 may be formed of an adhesive such as an Ultra-Violet (UV) glue, a Light-to-Heat Conversion (LTHC) glue, or the like, or other types of adhesives. The de-bonding layer 11 is decomposable under the heat of light to thereby release the carrier 10 from the overlying structures that will be formed in subsequent steps.

In some embodiments, a die 120a and a die 20b are attached side by side to the de-bonding layer 11 over the carrier 10 through an adhesive layer 12 such as a die attach film (DAF), silver paste, or the like. The die 120a and the die 20b may respectively be an application-specific integrated circuit (ASIC) chip, an analog chip, a sensor chip, a wireless and radio frequency chip, a voltage regulator chip, a memory chip or the like. The die 120a and the die 20b may be the same types of dies or the different types of dies. In some embodiments, the two dies 120a and 20b are two small die partitions with different function of a larger single die. The size (refers to the height and/or the width) of the two dies 120a and 20b may be the same or different. In some embodiments, a gap 21 is existed between the two dies 120a and 20b. The number of the dies attached to the carrier 10 is not limited to that is shown in FIG. 1A. In some other embodiments, one die or more than two dies are attached to the carrier 10.

In some embodiments, the two dies 120a and 20b have similar structures. For the sake of brevity, the die 120a is taken for example. The die 120a includes a substrate 13a, a pad 14a, a passivation layer 15a, conductive posts 19a and a protection layer 18a.

In some embodiments, the substrate 13 is made of silicon or other semiconductor materials. Alternatively or additionally, the substrate 13 includes other elementary semiconductor materials such as germanium, gallium arsenic, or other suitable semiconductor materials. In some embodiments, the substrate 13 may further include other features such as various doped regions, a buried layer, and/or an epitaxy layer. Moreover, in some embodiments, the substrate 13 is made of an alloy semiconductor such as silicon germanium, silicon germanium carbide, gallium arsenic phosphide, or gallium indium phosphide. Furthermore, the substrate 13 may be a semiconductor on insulator such as silicon on insulator (SOI) or silicon on sapphire.

The pads 14a may be a part of an interconnection structure (not shown) and electrically connected to the devices (not shown) formed on the substrate 13a. In some embodiments, the devices may be active devices, passive devices, or a combination thereof. In some embodiments, the devices are integrated circuit devices. The passivation layer 15a is formed over the substrate 13a and covers a portion of the pads 14a. A portion of the pads 14a is exposed by the passivation layer 15a and serves as an external connection of the die 120a. In some embodiments, the passivation layer 15a includes a first passivation layer 8a and a second passivation layer 9a on the first passivation layer 8a. The material of the first passivation layer 8a and the material of the second passivation layer 9a may be the same or different. The second passivation layer 9a is also referred as a post-passivation layer, and is optionally formed.

The conductive posts 19a are formed on and electrically connected to the pads 14a exposed by the passivation layer 15a. In some embodiments, the conductive post 19 includes a first portion 16a and a second portion 17a. The first portion 16a is embedded in and laterally covered by the passivation layer 15a. The second portion 17a is on the first portion 16a and the passivation layer 15a. In some embodiments, the second portion 17a covers a portion of the top surface of the passivation layer 15a. In some other embodiments, the second portion 17a is on the first portion 16a and does not cover the top surface of the passivation layer 15a. The second portion 17a is also referred as a connector. The conductive posts 19a include solder bumps, gold bumps, copper bumps, copper posts, copper pillars, or the like. The protection layer 18a is formed over the passivation layer 15a and aside the connectors 17a to cover the sidewalls of the connectors 17a. The passivation layer 15a and the protection layer 18a respectively include an insulating material such as silicon oxide, silicon nitride, polymer, or a combination thereof. The polymer includes polybenzoxazole (PBO), polyimide (PI), benzocyclobutene (BCB), a combination thereof or the like, for example. In some embodiments, the passivation layer 15a and the protection layer 18a are free of fillers. The materials of the passivation layer 15a and the protection layer 18a may be the same or different. In some embodiments, the top surface of the protection layer 18a is substantially level with the top surface of the connectors 17a.

Similar to the die 120a, the die 20b includes a substrate 13b, a pad 14b, a passivation layer 15b, and a conductive post 19b. In some embodiments, the passivation layer 15b includes a first passivation layer 8b and a second passivation layer 9b. The second passivation layer 9b is also referred as a post-passivation layer and is optionally formed. The conductive post 19b includes a first portion 16b and a second portion 17b. The second portion 17b is also refereed as a connector. The material and the structural characteristics of the substrate 13b, the pad 14b, the passivation layer 15b, and the conductive post 19b of the die 20b are substantially the same as or different from those of the substrate 13a, the pad 14a, the passivation layer 15a, the conductive post 19a of the die 120a. The die 20b differs from the die 120a in that, no protection layer is formed aside the connectors 17b. That is to say, the sidewalls of the connectors 17b are not covered by a protection layer, but exposed. In some embodiments, the top surfaces of the connectors 17a and the top surfaces of the connectors 17b are substantially coplanar with each other, but the disclosure is not limited thereto. In some other embodiments, the top surfaces of the connectors 17a and the top surfaces of the connectors 17b may be not coplanar with each other.

In some embodiments, the dies 120a and 20b respectively has a first sidewall 40a and a second sidewall 40b opposite to each other. The first sidewall 40a of the die 120a or 20b is the sidewall adjacent to another die 20b or 120a, and the second sidewall 40b of the die 120a or 20b is the sidewall far away from another die 20b or 120a. The first sidewalls 40a and the second sidewalls 40b may be straight or inclined.

Figure 1B:
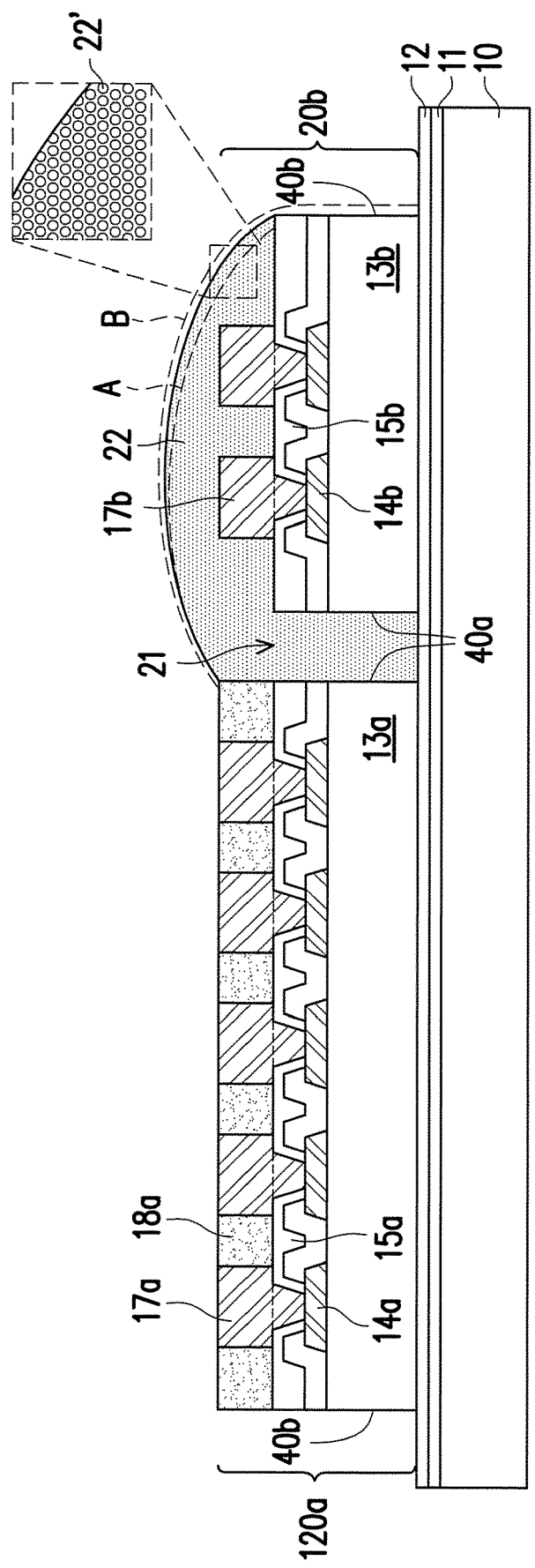

Referring to FIG. 1B, a first encapsulant material layer 22 is formed over the carrier 10 and on the die 20b. The first encapsulant material layer 22 fills in the gap 21 between the die 120a and the die 20b, at least encapsulates the first sidewalls 40a of the dies 120a and 20b, the top surfaces and sidewalls of the connectors 17b of the die 20b, and a portion of top surface of the passivation layer 15b of the die 20b. In some embodiments, the top surface of the passivation layer 15b is completely covered by the first encapsulant material layer 22, but the disclosure is not limited thereto. In some other embodiments, a portion of the top surface of the passivation layer 15b at an edge (the edge adjacent to the second sidewall 40b) of the die 20b may be not covered by the first encapsulant material layer 22 (shown as the dotted line A). In some embodiments, the top surface of the die 120a, and the second sidewall 40b of the die 20b are not covered by the first encapsulant material layer 22, but the disclosure is not limited thereto. In some other embodiments, the first encapsulant material layer 22 may further extend to cover the top surface of the die 120a or/and the sidewall 40b of the die 20b (shown as dotted line B).

In some embodiments, the first encapsulant material layer 22 is formed of an underfill material, a molding underfill material, polymer, or a combination thereof. The polymer includes polybenzoxazole (PBO), polyimide (PI), benzocyclobutene (BCB), a combination thereof or the like. Referring to the enlarged view of the first encapsulant material layer 22, in some embodiments in which the first encapsulant material layer 22 is formed of underfill material or molding underfill material, the first encapsulant material layer 22 includes polymer and a plurality of fillers 22'. The filler 22' may be a powdered inorganic material, the filler 22' may be a single element, a compound such as nitride, or a combination thereof, e.g., silica, alumina, carbon, or aluminum nitride, or mixtures thereof. In some embodiments, the filler 22' is fine filler whose particle size is very small. The average particle size of the filler 22' ranges from 0.1 μm to 10 μm, or even smaller than 0.1 μm, for example. In some other embodiments, the first encapsulant material layer 22 may be free of filler. The first encapsulant material layer 22 may be formed by a dispensing process, for example. In some embodiments, after the first encapsulant material layer 22 is dispensed in the gap 21 and on the die 20b, a curing process is further performed.

Still referring to FIG. 1B, in some embodiments, the surface of the first encapsulant material layer 22 is unflat. The first encapsulant material layer 22 may be tapered towards the die 20b. The surface of the first encapsulant material layer 22 may have a curved profile, an inclined profile, an arced profile, or a combination thereof. In some embodiments, the surface of the first encapsulant material layer 22 is higher than the top surface of the protection layer 18a of the die 120a.

Figure 1C:
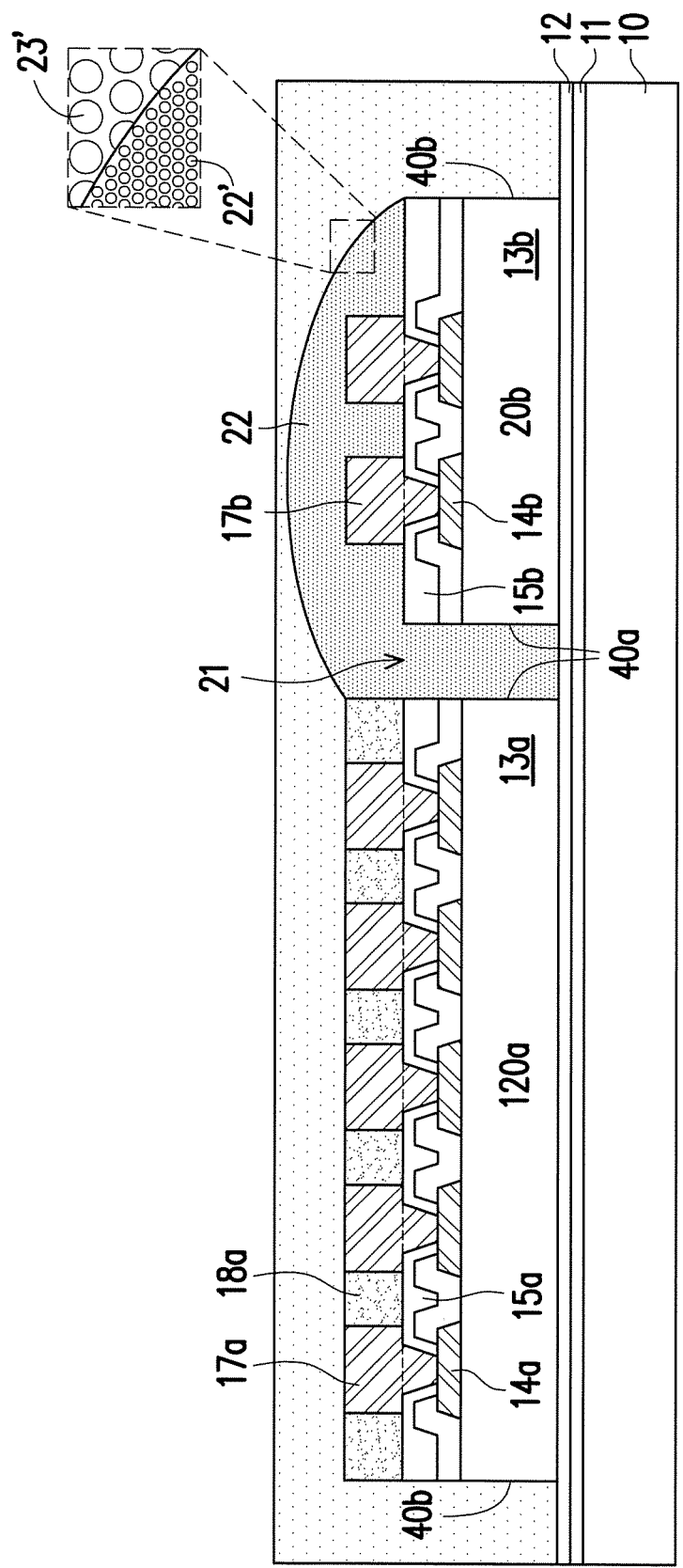

Referring to FIG. 1C, a second encapsulant material layer 23 is formed over the carrier 10 and the dies 120a and 20b, so as to encapsulate the second sidewalls 40b of the dies 120a and 20b, the top surface of the die 120a and the top surface of the first encapsulant material layer 22. The material of the second encapsulant material layer 23 may be the same as or different from the material of the first encapsulant material layer 22. In some embodiments, the first encapsulant material layer 22 and the second encapsulant material layer 23 comprise the same material with different physical characteristics (e.g. particle size). The second encapsulant material layer 23 includes a molding compound, for example. In some embodiments, the second encapsulant material layer 23 is formed by a process different from that of the first encapsulant material layer 22, such as a molding process.

Referring to the enlarged view of the first encapsulant material layer 22 and the second encapsulant material layer 23, in some embodiments, the second encapsulant material layer 23 is a composite material including a polymer and a plurality of fillers 23'. The filler 23' may be a single element, a compound such as nitride, oxide, or a combination thereof. The fillers 23' may comprise silicon oxide, aluminum oxide, boron nitride, alumina, silica, and the like, for example. The cross-section shape of the filler 22' or 23' may be circle, square, rectangle, or any other shape, and the disclosure is not limited thereto. In some embodiments, the particle size of the filler 23' is larger than the particle size of the filler 22', herein, the particle size of the filler 22' or 23' refers to the diameter, length, width or height of the filler 22' or 23'. The average particle size of the filler 23' ranges from 3 μm to 30 μm, or even larger than 30 μm, for example. In some embodiments, the particle size is referred to the average particle size D50, and the average particle size D50 of the filler 23' is larger than the average particle size D50 of the filler 22'.

Figure 1D:
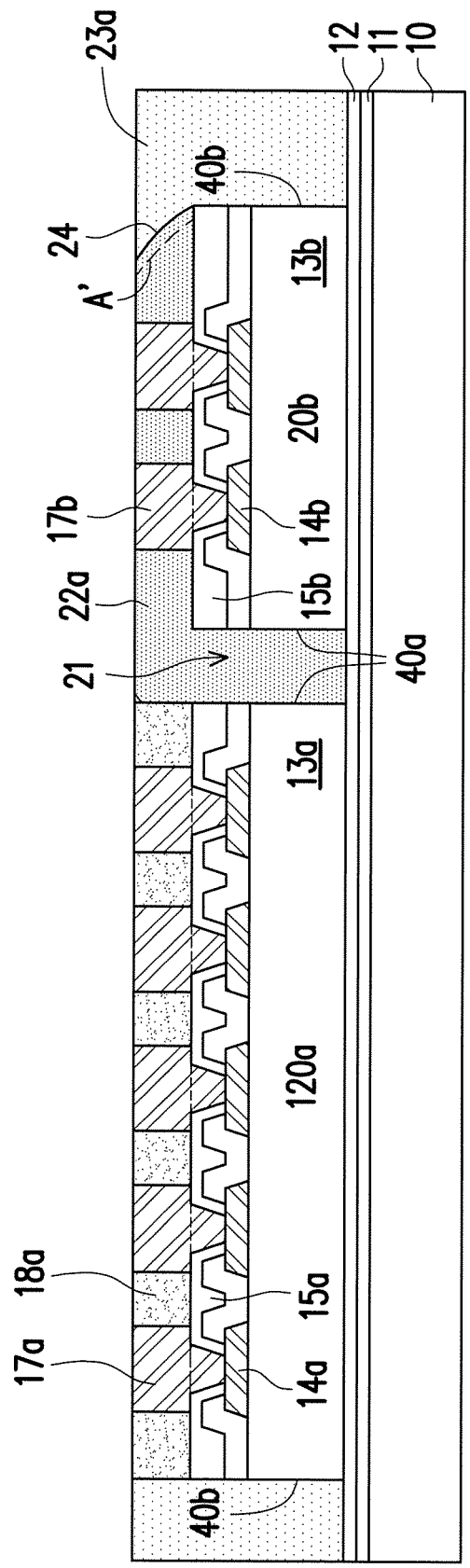

Referring to FIG. 1C and FIG. 1D, a planarization process is performed, and a portion of the second encapsulant material layer 23 and a portion of the first encapsulant material layer 22 are removed, such that the connectors 17a of the die 120a and the connectors 17b of the die 20b are exposed, and a first encapsulant 22a and a second encapsulant 23a are formed. In some embodiments in which the top surfaces of the connectors 17a and the top surfaces of the connectors 17b are not coplanar with each other, ones of the connectors 17a and the connectors 17b at a higher level are removed during the planarization process, that is, portions of the connectors 17a and a portion of the protection layer 18a, or portions of the connectors 17b are also removed during the planarization process. In some embodiments, after the planarization process, the top surfaces of the connectors 17a and the protection layer 18a of the die 120a, the top surfaces of the connectors 17b of the die 20b, the top surface of the first encapsulant 22a, and the top surface of the second encapsulant 23a are substantially coplanar with each other. The planarization process includes a grinding process or a polishing process, such as a chemical mechanical polishing (CMP) process. After the planarization process, as the first encapsulant 22a is formed of materials free of filler or including fine fillers, the first encapsulant 22a may have a substantially flat surface, and the problem of roughness surface or pits may be caused by large fillers is avoided. In some embodiments in which the second encapsulant 23a includes fillers having larger particle size than the first encapsulant 22a, the top surface of the first encapsulant 22a is more flat than the top surface of the second encapsulant 23a.

Referring to FIG. 1D, in some embodiments, the first encapsulant 22a is disposed in the gap 21 between the dies 120a and 20b, and on the passivation layer 15b of the die 20b, encapsulating the first sidewalls 40a of the dies 120a and 20b, and sidewalls of the connectors 17b. That is to say, the connectors 17b of the die 20b are laterally covered by and in contact with the first encapsulant 22a. The second encapsulant 23a is aside and laterally encapsulants the sidewall of the first encapsulant 22a, and the second sidewalls of the dies 120a and 20b.

Still referring to FIG. 1D, an interface 24 is existed between the first encapsulant 22a and the second encapsulant 23a. The interface 24 is on an edge of the die 20b. In some embodiments, the interface 24 is connected to the second sidewall 40b of the die 20b. The interface 24 and the second sidewall 40b may be not coplanar. In some other embodiments, the interface 24 is not connected to the second sidewall 40b of the die 20b (shown as the dotted line A'). The profile of the interface 24 is inclined, curved, or arced, for example.

Interfaces also exist between the protection layer 18a and the first encapsulant 22a, and between the protection layer 18a and the second encapsulant 23a. In some embodiments, the interface between the protection layer 18a and the first encapsulant 22a and the interface between the protection layer 18a and the second encapsulant 23a may respectively be straight or inclined.

Figure 1E:
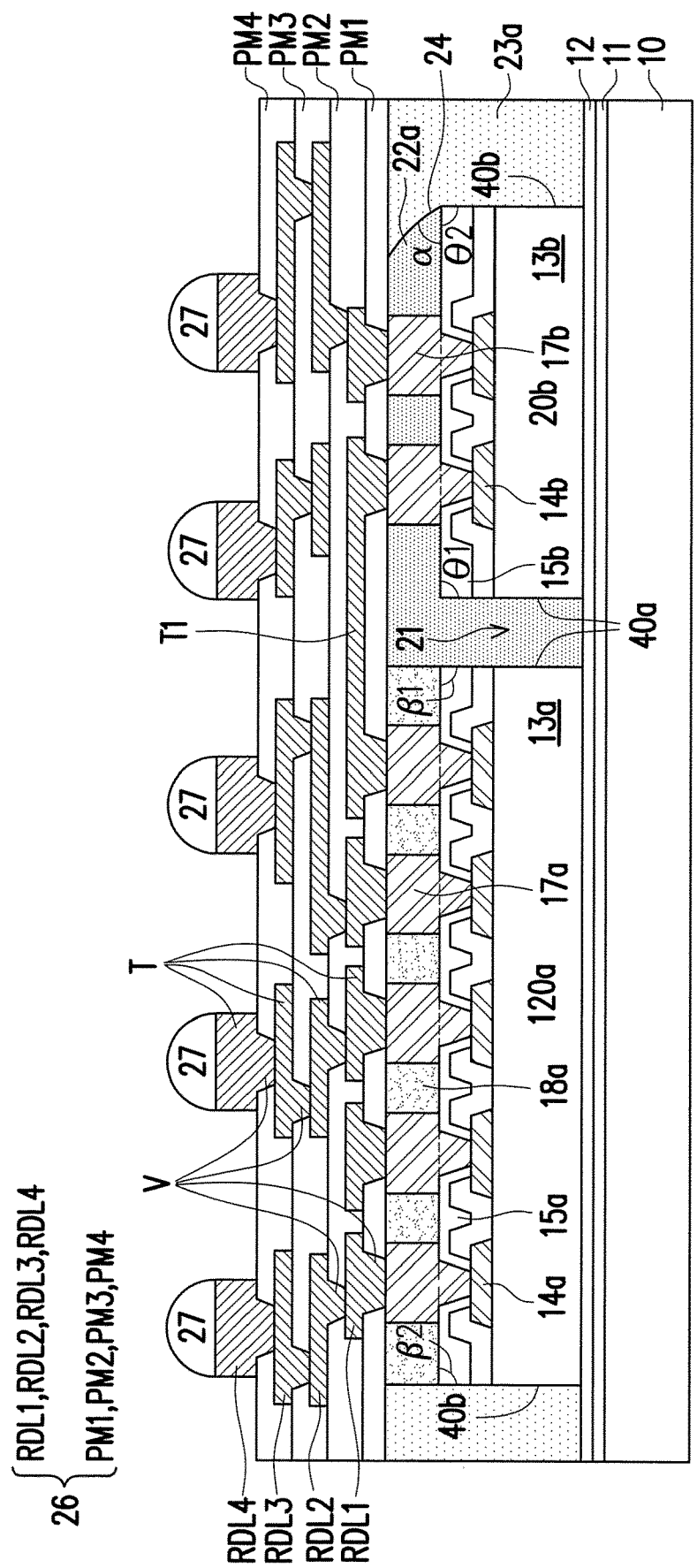

Referring to FIG. 1E, a redistribution layer (RDL) structure 26 is formed over and electrically connected to the dies 120a and 20b. In some embodiments, the die 120a and the die 20b are electrically connected to each other through the RDL structure 26. In some embodiments, the RDL structure 26 is referred as a "front-side redistribution layer structure", wherein the "front-side" refers to a side close to the connectors 17a and 17b of the dies 120a and 20b. In some embodiments, the RDL structure 26 includes a plurality of polymer layers PM1, PM2, PM3 and PM4 and a plurality of redistribution layers RDL1, RDL2, RDL3 and RDL4 stacked alternately. The number of the polymer layers or the redistribution layers is not limited by the disclosure.

The redistribution layer RDL1 penetrates through the polymer layer PM1 and is electrically connected to the connectors 17a and 17b of the dies 120a and 20b. The redistribution layer RDL2 penetrates through the polymer layer PM2 and is electrically connected to the redistribution layer RDL1. The redistribution layer RDL3 penetrates through the polymer layer PM3 and is electrically connected to the redistribution layer RDL2. The redistribution layer RDL4 penetrates through the polymer layer PM4 and is electrically connected to the redistribution layer RDL3.

The material of the polymer layer PM1, PM2, PM3, PM4 may be the same as or different from the material of the protection layer 18a of the die 120a, the material of the first encapsulant 22a or the material of the second encapsulant 23a. In some embodiments, each of the polymer layers PM1, PM2, PM3 and PM4 includes a photo-sensitive material such as polybenzoxazole (PBO), polyimide (PI), benzocyclobutene (BCB), a combination thereof or the like. In some embodiments, the protection layer 18a is referred as a polymer layer PM0.

In some embodiments, each of the redistribution layers RDL1, RDL2, RDL3 and RDL4 includes conductive materials. The conductive materials includes metal such as copper, nickel, titanium, a combination thereof or the like, and is formed by an electroplating process. In some embodiments, the redistribution layers RDL1, RDL2, RDL3 and RDL4 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals.

In some embodiments, the redistribution layers RDL1, RDL2, RDL3 and RDL4 respectively includes a plurality of vias V and a plurality of traces T connected to each other. The vias V vertically penetrate through the polymer layers PM1, PM2, PM3 and PM4 to connect the traces T of the redistribution layers RDL1, RDL2, RDL3 and RDL 4, and the traces T are respectively located on the polymer layers PM1, PM2, PM3 and PM 4, and are respectively horizontally extending on the top surface of the polymer layers PM1, PM2, PM3 and PM4.

In some embodiments, the traces T of the redistribution layers RDL1, especially the traces T1 connecting the die 120a and the die 20b, are routing over the first encapsulant 22a and the protection layer 18a, and not over the second encapsulant 23a. As the top surface of the first encapsulant 22a is relatively more flat than the top surface of the second encapsulant 23a, therefore, the traces T or T1 on the first encapsulant 22a may achieve a fine quality, and the trace broken (open) or bridge (short) issues may occur due to the roughness of the encapsulant is avoided.

In some embodiments, the redistribution layer RDL4 is the topmost redistribution layer of the RDL structure 26, and is referred as an under-ball metallurgy (UBM) layer for ball mounting.

Still referring to FIG. 1E, thereafter, a plurality of connectors 27 are formed over and electrically connected to the redistribution layer RDL4 of the RDL structure 26. In some embodiments, the connectors 27 are referred as conductive terminals. In some embodiments, the connectors 27 may be ball grid array (BGA) connectors, solder balls, controlled collapse chip connection (C4) bumps, or a combination thereof. In some embodiments, the material of the connector 27 includes copper, aluminum, lead-free alloys (e.g., gold, tin, silver, aluminum, or copper alloys) or lead alloys (e.g., lead-tin alloys). The connector 27 may be formed by a suitable process such as evaporation, plating, ball dropping, screen printing and reflow process, a ball mounting process or a C4 process. In some embodiments, metal posts or metal pillars may further be formed between the redistribution layer RDL4 and the connectors 27 (not shown). The connectors 27 are electrically connected to the two dies 120a and 20b through the RDL structure 26.

Figure 1F:
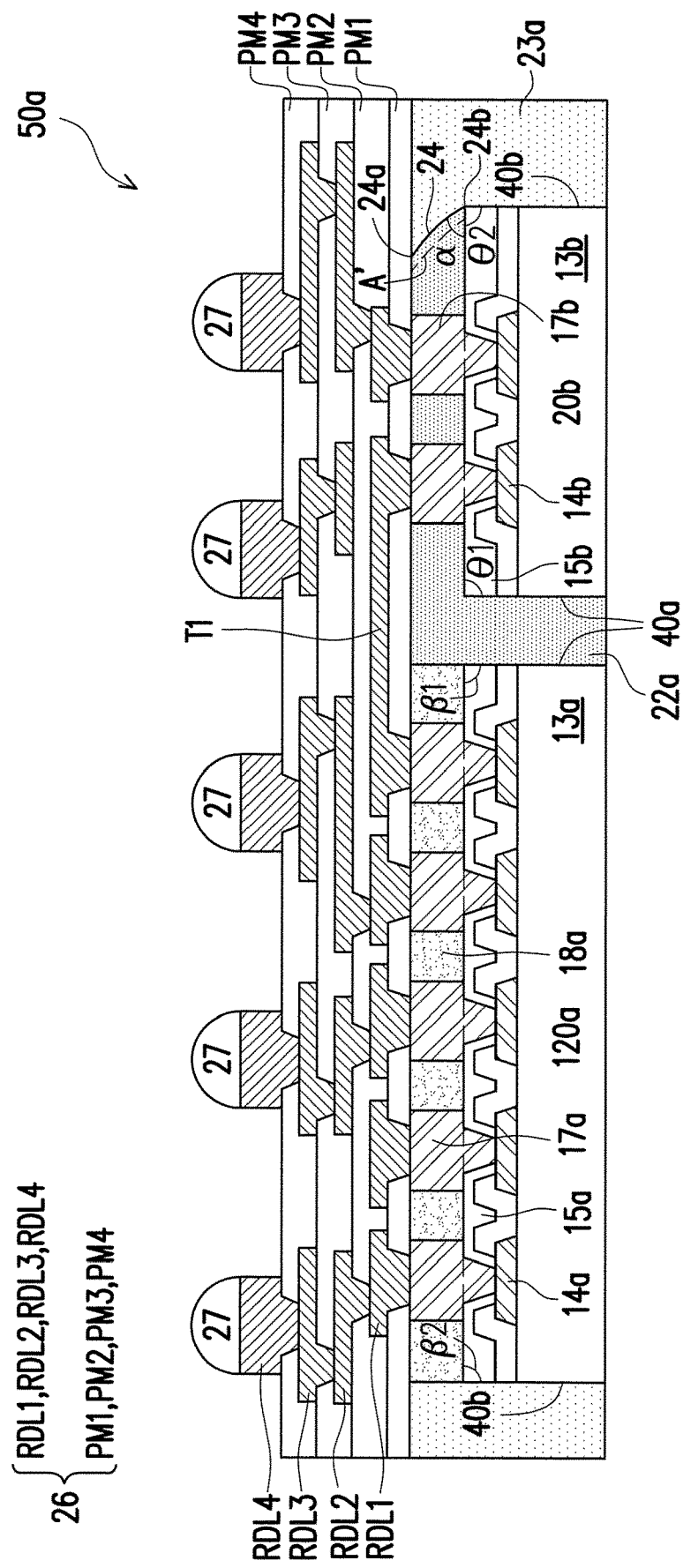

Referring to FIG. 1E and FIG. 1F, the de-bonding layer 11 is decomposed under the heat of light, and the carrier 10 is then released. In some embodiments, the adhesive layer 12 is then removed by, for example, a cleaning process. The bottom surfaces (or referred as back surfaces) of the dies 120a and 20b, that is, the bottom surfaces of the substrates 13a and 13b are exposed.

Referring to FIG. 1F, a package structure 50a is thus completed. The package structure 50a is also referred as a fan-out package structure. The package structure 50a includes the two dies 120a and 20b, the first encapsulant 22a, the second encapsulant 23a, the RDL structure 26 and the connectors 27. The die 120a and the die 20b are connected through the RDL structure 26.

In some embodiments, the first encapsulant 22a is located between the die 120a and the die 20b, and on the die 20b.

The first encapsulant 22a at least encapsulates the first sidewall 40a of the die 120a, the first sidewall 40a of the die 20b, the sidewalls of the connectors 27 of the die 20b, and a portion of the top surface of the passivation layer 15b of the die 20b. In some embodiments, the cross-section shape of the portion of the first encapsulant 22a under the trace T1 is reversed L-shaped, for example. In some embodiments, the sidewalls of the portion of the first encapsulant 22a between the two dies 120a and 13b are straight or inclined. The sidewall of the first encapsulant 22a on the edge of the die 20b is inclined, curved, or arced.

In some embodiments, the second encapsulant 23a is aside and encapsulates the sidewall of the first encapsulant 22a, aside and encapsulates the second sidewalls 40b of the dies 120a and 20b.

The connectors 17a of the die 120a are laterally covered by and in contact with the protection layer 18a, and are separated from the first encapsulant 22a. The protection layer 18a of the die 120a is in contact with the first encapsulant 22a at the first sidewall 40a of the die 120a, and in contact with the second encapsulant 23a at the second sidewall 40b of the die 120a. The connectors 17b of the die 20b are laterally covered by and in contact with the first encapsulant 22a, and separated from the second encapsulant 23a.

The corner θ1 of the die 20b is covered by and in contact with the first encapsulant 22a. The corner θ2 of the die 20b is covered by and in contact with the first encapsulant 22a or/and the second encapsulant 23a. The corner β1 of the die 120a is covered by and in contact with the protection layer 18a and the first encapsulant 22a. The corner β2 of the die 120a is covered by and in contact with the protection layer 18a and the second encapsulant 23a. Herein, the corners θ1 and θ2 are referred to the corners of the passivation layer 15b of the die 20b, the corners β1 and β2 are referred to the corners of the passivation layer 15b of the die 20b.

In some embodiments, the interface 24 includes two end points 24a and 24b. The end point 24a is in contact with the polymer layer PM1 of the RDL structure 26, and at the same plane as the top surfaces of the connectors 17a/17b. The end point 24b is on the edge of the die 20b and is in contact with the protection layer 15b. In some embodiments, the end point 24b is on the top surface of the protection layer 15b, and away from the second sidewall 40b of the die 20b. In some embodiments, the end point 24b is at the intersection point of the top surface of the passivation layer 15b and the second sidewall 40b of the die 20b. In some embodiments, an included angle α between the interface 24 and the top surface of the passivation layer 15b is less than 90°. In other words, the interface 24 is inclined towards the connector 17a of the die 20b. A portion of the second encapsulant 23a is located over the die 20b.

In some embodiments in which the interface 24 is connected to the second sidewall 40b of the die 20b, the top surface of the passivation layer 15b of the die 20b is covered by the first encapsulant 22a, and is not in contact with the second encapsulant 23a. However, the disclosure is not limited thereto. In some other embodiments in which the interface 24 is not connected to the second sidewall 40b of the die 20b (shown as the dotted line A'), a portion of the top surface of the passivation layer 15b adjacent to the corner θ2 is not covered by the first encapsulant 22a, but is covered by the second encapsulant 23a.

In some embodiments, the package structure 50a may further be electrically coupled to other package components such as a printed circuit board (PCB), a flex PCB, or the like through the connectors 27.

Figure 4:
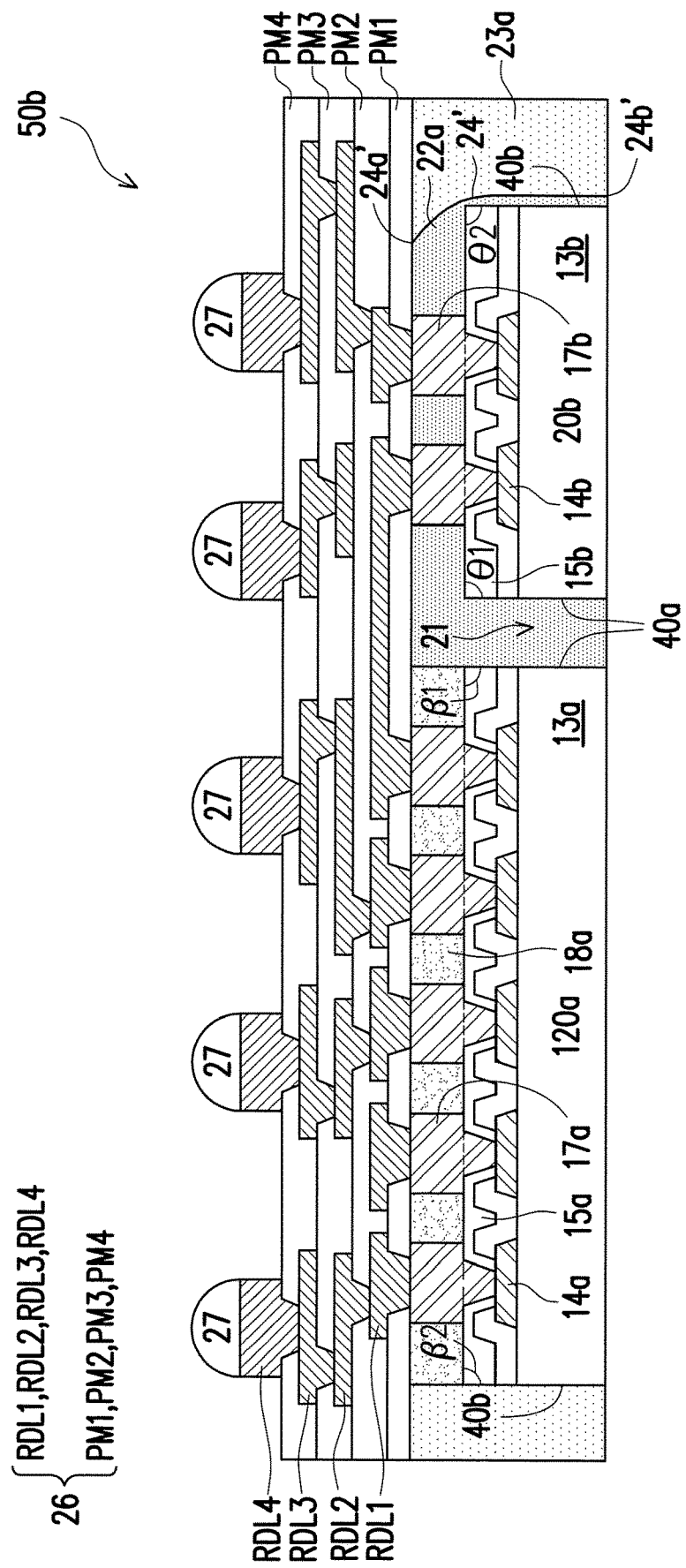
FIG. 4 is a schematic cross-sectional view illustrating a package structure according to some embodiments of the disclosure.

Referring to FIG. 4, in some embodiments in which the first encapsulant material layer 22 further extends to cover the second sidewall 40b of the die 20b, a package structure 50b is formed. The package structure 50b is similar to the package structure 50a, but differs from the package structure 50a in that the first encapsulant 22a further extends to cover the second sidewall 40b of the die 20b, and the other structural characteristics of package structure 50b are substantially the same as those of the package structure 50a.

Still referring to FIG. 4, in the package structure 50b, the first encapsulant 22a encapsulates the first sidewall 40a of the die 120a, the first sidewall 40a and the second sidewall 40b of the die 20b, the sidewalls of the connectors 17b of the die 20b, and the top surface of the passivation layer 15a of the die 20b. The interface 24' between the first encapsulant 22a and the second encapsulant 23a is over the edge of the die 20b, and aside the second sidewall 40b of the die 20b. The interface 24' is not connected to the second sidewall 40b of the die 20b. In some embodiments, the interface 24' is not in contact with the passivation layer 15b of the die 20b. The interface 24' includes two end points 24a' and 24b'. The interface 24' differs from the interface 24 in that the end point 24b' is aside the second sidewall 40b of the die 20b, and at a same plane as the bottom surfaces of the dies 120a and 20b.

In some embodiments, the first sidewall 40a, the second sidewall 40b and the corners θ1 and θ2 of the die 20b are covered and in contact with the first encapsulant 22a, and are not in contact with the second encapsulant 23a. The second sidewall 40b and the corner θ2 of the die 20b are separated from the second encapsulant 23a by the first encapsulant 22a therebetween. The structural relationship between the die 120a and the encapsulants 22a and 23a are substantially the same as those of the package structure 50a (FIG. 1F), which is not described again.

FIG. 2A to FIG. 2F are schematic cross-sectional views illustrating a forming method of a package structure according to a second embodiment of the disclosure. The second embodiment is similar to the first embodiment, but differs from the first embodiment in that, the sidewalls of the connectors 17a of the die 20a are not surrounded by a protection layer, but encapsulated by a first encapsulant 122a.

Figure 2A:
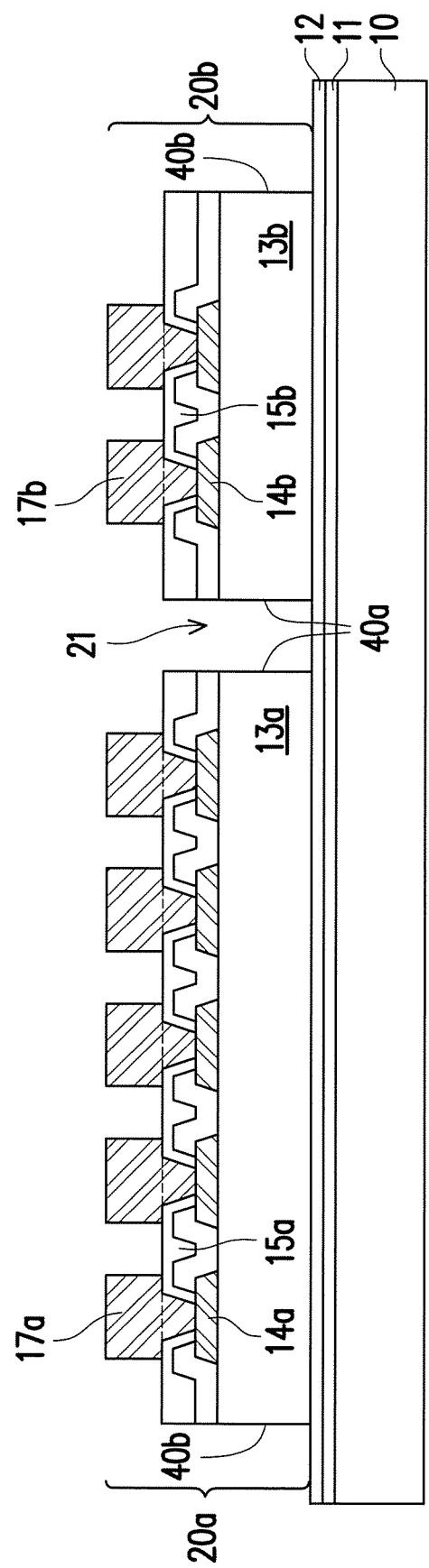
FIG. 2A to FIG. 2F are schematic cross-sectional views illustrating a method of forming a package structure according to a second embodiment of the disclosure.

Referring to FIG. 2A, processes similar to those of the first embodiment are performed, a de-bonding layer 11 is formed on a carrier 10, a first die 20a and a second die 20b are attached to the de-bonding layer 11 over the carrier 10 through an adhesive layer 12. A gap 21 is existed between the die 20a and the die 20b. In this embodiment, both the connectors 17a of the die 20a and the connectors 17b of the die 20b are not surrounded by a protection layer, that is to say, the sidewalls of the connectors 17a and 17b and the top surface of the passivation layer 15a and 15b are exposed. The other features of the die 20a and the die 20b are substantially the same as those of the die 120a and the die 20b in the first embodiment.

Figure 2B:
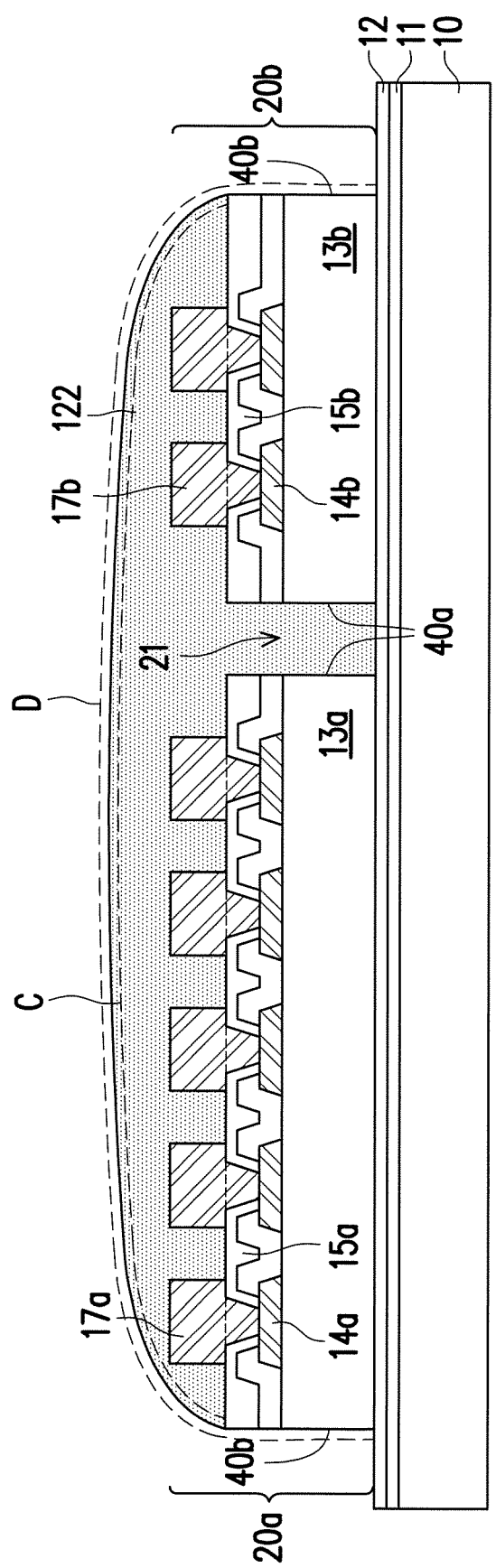

Referring to FIG. 2B, a first encapsulant material layer 122 is formed on the dies 20a and 20b, and fills in the gap 21 between the dies 20a and 20b. In some embodiments, the first encapsulant material layer 122 at least encapsulates the first sidewalls 40a of the dies 20a and 20b, portions of the top surfaces of the passivation layer 15a and 15b, the sidewalls and the top surfaces of the connectors 17a and 17b. The material and the forming method of the first encapsulant material layer 122 are substantially the same as those of the first encapsulant material layer 22 in the first embodiment. In some embodiment, the surface of first encapsulant material layer 122 is unflat, and may have an inclined, a curved or an arced profile, for example.

In some embodiments, the top surfaces of the passivation layer 15a and 15b are completely covered by the first encapsulant material layer 122, but the disclosure is not limited thereto. In some other embodiments, portions of the top surfaces of the passivation layer 15a and 15b on the edge (the edge adjacent to the second sidewalls 40b) of the dies 20a and 20b may be not covered by the first encapsulant material layer 122, but exposed (shown as the dotted line C).

In some embodiments, the second sidewalls 40b of the dies 20a and 20b are not covered by the first encapsulant material layer 22, and are exposed. However, the disclosure is not limited thereto. In some other embodiments, the first encapsulant material layer 122 may further extend to encapsulate the second sidewalls 40b of the dies 20a and 20b (shown as the dotted line D).

Figure 2C:
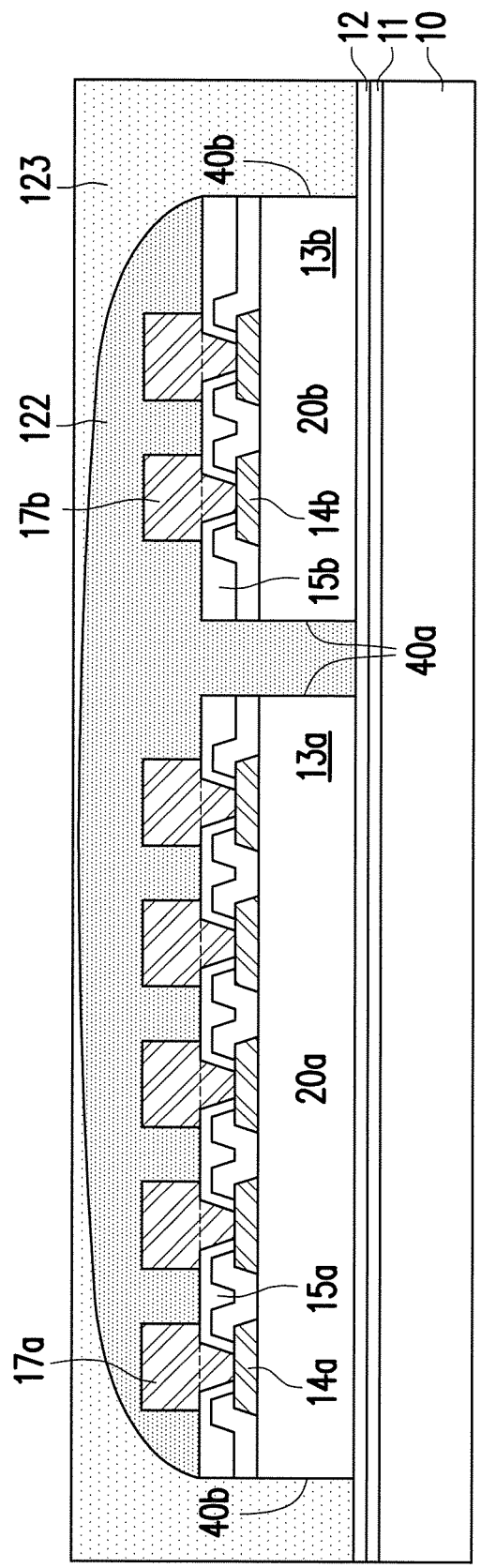

Referring to FIG. 2C, a second encapsulant material layer 123 is formed on the carrier 10 and on the first encapsulant material layer 122. In some embodiments, the second encapsulant material layer 123 encapsulates the second sidewalls 40b of the dies 20a and 20b and the top surface of the first encapsulant material layer 122. The material and the forming method of the second encapsulant material layer 123 are substantially the same as those of the second encapsulant material layer 23 in the first embodiment.

Figure 2D:
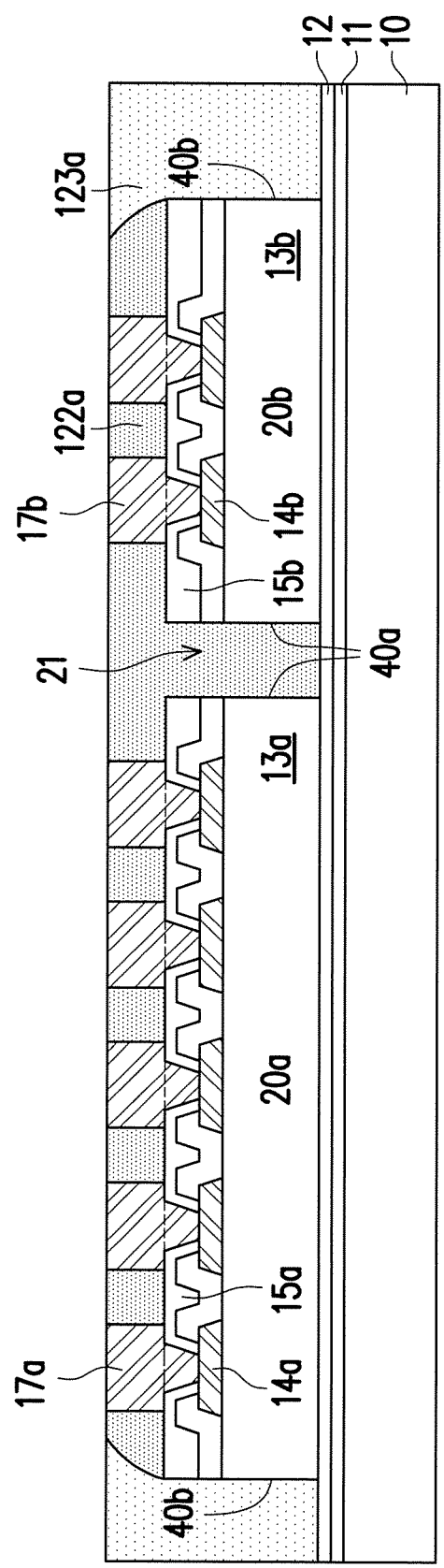

Referring to FIG. 2C and FIG. 2D, a planarization process is performed, and a portion of the second encapsulant material layer 123 and a portion of the first encapsulant material layer 122 are removed, such that the connectors 17a of the die 20a and the connectors 17b of the die 20b are exposed, and a first encapsulant 122a and a second encapsulant 123a are formed. In some embodiments, the top surfaces of the connectors 17a and 17b, the top surface of the first encapsulant 122, and the top surface of the second encapsulant 123 are substantially coplanar with each other.

Figure 2E:
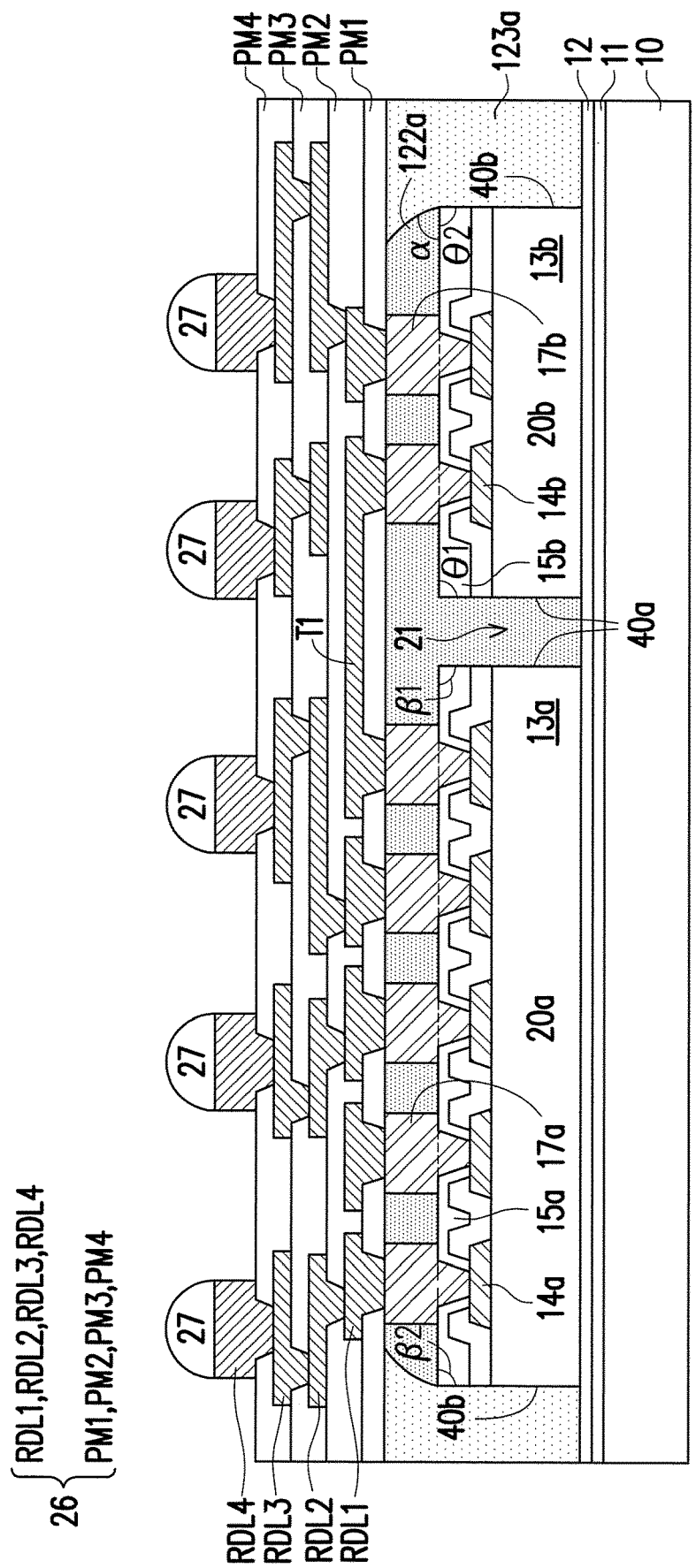
Figure 2F:
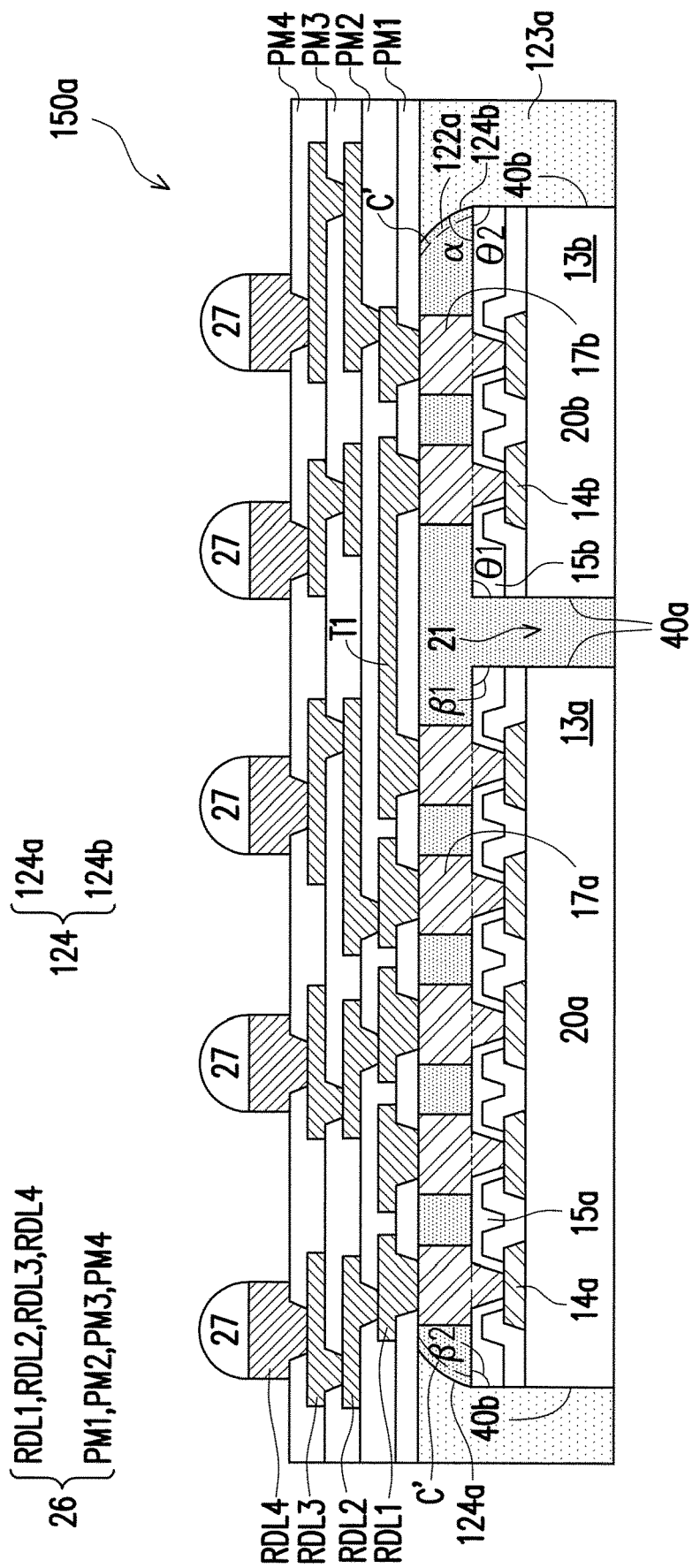

Referring to FIG. 2E and FIG. 2F, processes similar to those described in FIG. 1E and FIG. 1F are performed, a RDL structure 26 is formed on the dies 20a and 20b, on the first encapsulant 122a and the second encapsulant 123a. The RDL structure 26 includes polymer layers PM1, PM2, PM3, PM4 and redistribution layers RDL1, RDL2, RDL3, RDL4. A plurality of connectors 27 are formed on the redistribution layer RDL4 of the RDL structure 26. The connectors 27 are electrically connected to the dies 20a and 20b through the RDL structure 26.

Thereafter, the de-bonding layer 11 is decomposed under the heat of light, and the carrier 10 is then released. In some embodiments, the adhesive layer 12 is removed by, for example, a cleaning process. The bottom surfaces (or referred as back surfaces) of the dies 20a and 20b are exposed.

Referring to FIG. 2F, a package structure 150a is thus completed. The package structure 150a includes the two dies 20a and 20b, the first encapsulant 122a, the second encapsulant 123a, the RDL structure 26 and the connectors 27. In some embodiments, the die 20a and the die 20b are electrically connected to each other through the RDL structure 26.

The first encapsulant 122a is located between the die 20a and the die 20b, and on the dies 20a and 20b. The first encapsulant 122a at least encapsulates and contacts with the first sidewalls 40a of the dies 20a and 20b, the sidewalls of the connectors 17a and 17b, and portions of the top surfaces of the passivation layer 15a and 15b. The top surface of the first encapsulant 122a is in contact with the bottom surface of the polymer layer PM1. In some embodiments, the cross-section shape of the portion of the first encapsulant 122a under the trace T1 of the RDL1 is T-shaped. In some embodiments, the sidewalls of the first encapsulant 122a are inclined, curved, or arced.

The second encapsulant 123a is located aside and encapsulates the second sidewalls 40b of the dies 20a and 20b and the sidewalls of the first encapsulant 122a.

An interface 124 is existed between the first encapsulant 122a and the second encapsulant 123a. The interface 124 includes a first interface 124a and a second interface 124b. The interface 124a is on an edge (the edge adjacent to the corner β2) of the die 120a. In some embodiments, the first interface 124a is connected to the second sidewall 40b of the die 20a. In some other embodiments, the first interface 124a is not connected to the second sidewall 40b of the die 20a (shown as the dotted line C'). The interface 124b is on an edge (the edge adjacent to the corner θ2) of the die 20b. In some embodiments, the second interface 124b is connected to the second sidewall 40b of the die 20b. In some other embodiments, the interface 124b is not connected to the second sidewall 40b of the die 20b (shown as the dotted line). In some embodiments, the first interface 124a and the second interface 124b are symmetrical to each other, but the disclosure is not limited thereto. The structural characteristics of the first interface 124a and the second interface 124b are respectively similar to those of the interface 24 shown in FIG. 1F, and is not described again.

The connectors 17a of the die 20a and the connectors 17b of the die 20b are laterally covered by and in contact with the first encapsulant 122a, and are separated from the second encapsulant 123a. The corner β1 of the die 20a and the corner θ1 of the die 20b are covered by and in contact with the first encapsulant 122a. The corner β2 of the die 20a and the corner θ2 of the die 20b are covered by and in contact with the first encapsulant 122a or/and the second encapsulant 123a. In some embodiments in which the interface 124 is on the edges of the dies 20a and 20b, and not connected to the second sidewalls 40b of the dies 20a and 20b (shown as the dotted line C'), the corner β2 of the die 20a and the corner θ2 of the die 20b are covered by the second encapsulant 123a.

In some embodiments, the top surfaces of passivation layer 15a and the passivation layer 15b are covered by the first encapsulant 122a, and are not in contact with the second encapsulant 123a, but the disclosure is not limited thereto. In some other embodiments, a portion of the top surface of the passivation layer 15a adjacent to the corner β2 of the die 20a, and a portion of the top surface of the passivation layer 15b adjacent to the corner θ2 of the die 20b are not covered by the first encapsulant 122a, but covered by the second encapsulant 123a (shown as the dotted line C').

Thereafter, the package structure 150a may further be electrically coupled to other package components such as a printed circuit board (PCB), a flex PCB, or the like through the connectors 27.

Figure 5:
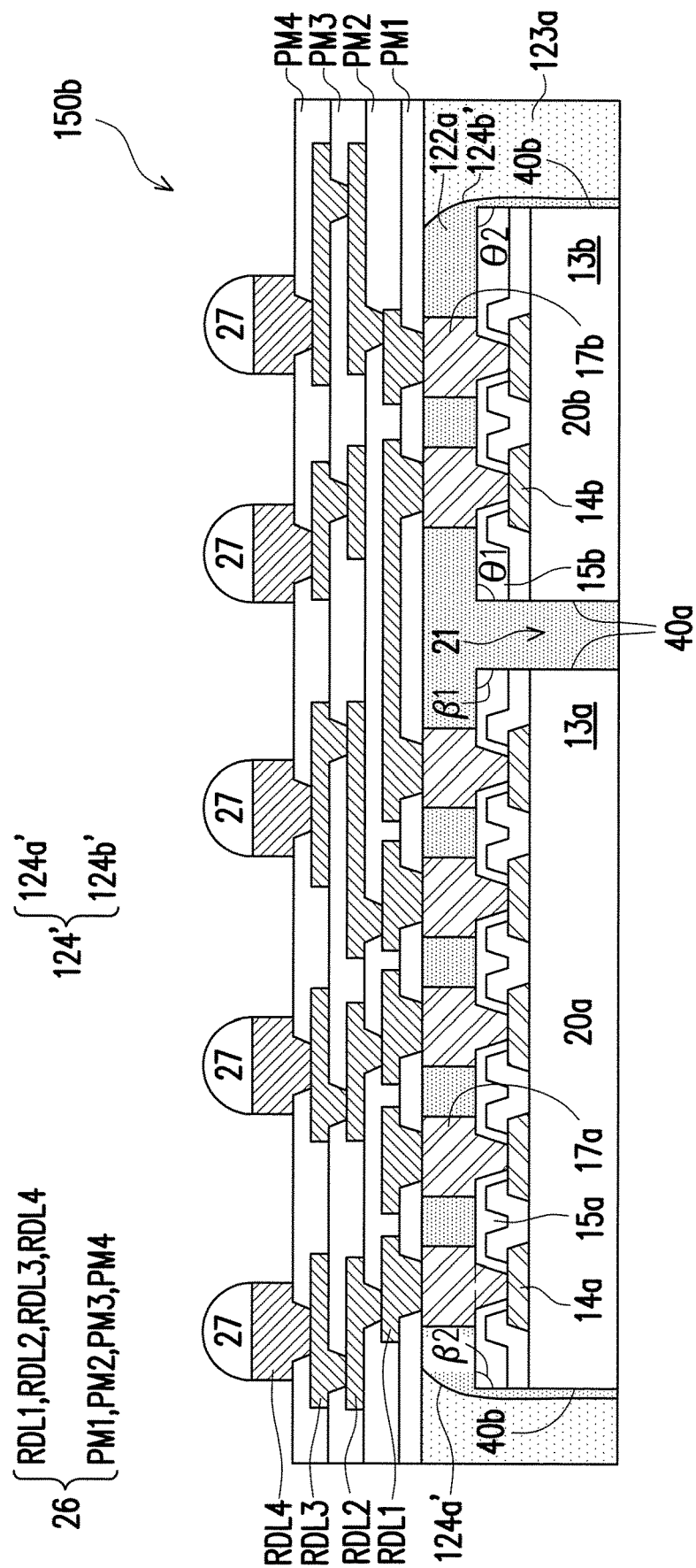
FIG. 5 is a schematic cross-sectional view illustrating a package structure according to some embodiments of the disclosure.

Referring to FIG. 5, in some embodiments in which the first encapsulant material layer 122 further extend to encapsulate the second sidewalls 40b of the dies 20a and 20b, a package structure 150b is formed. The package structure 150b is similar to the package structure 150a, but differs from the package structure 150a in that the first encapsulant 122a further extends to cover the second sidewalls 40b of the dies 20a and 20b, and the other structural characteristics of the package structure 150b are substantially the same as those of the package structure 150a.

Still referring to FIG. 5, in the package structure 150b, the first encapsulant 122a laterally encapsulates and contacts with the first sidewalls 40a and the second sidewalls 40b of the dies 20a and 20b, and is on the dies 20a and 20b, encapsulating and contacting with the sidewalls of the connectors 17a and 17b, and the top surfaces of the passivation layers 15a and 15b of the die 20a.

The second encapsulant 123a is located aside the first encapsulant 122a, encapsulating the sidewalls of the first encapsulant 122a. The second encapsulant 123a is not in contact with the second sidewalls 40b of the dies 20a/20b, but separated from the dies 20a/20b by the first encapsulant 122a therebetween.

The interface 124' between the first encapsulant 122a and the encapsulant 123a is not in contact with the edge of the dies 20a and 20b, or connected to the second sidewalls 40b of the dies 20a and 20b. Instead, portions of the interface 124' are located aside the second sidewalls 40b of the dies 20a and 20b. The interface 124' includes a first interface 124a' aside the second sidewall 40b of the die 20a, and a second interface 124b' aside the second sidewall 40b of the die 20b. In some embodiments, the first interface 124a' and the second interface 124b' are symmetrical to each other, but the disclosure is not limited thereto. The structural characteristics of the first interface 124a' and the second interface 124b' are respectively similar to those of the interface 24' shown in FIG. 4, and is not described again.

FIG. 3A to FIG. 3F are schematic cross-sectional views illustrating a forming method of a package structure according to a third embodiment of the disclosure. The third embodiment is similar to the foregoing embodiments, but differs from the foregoing embodiments in that, the sidewalls of the connectors 17a are surrounded by and in contact with a protection layer 18a of a die 120a, and the sidewalls of the connectors 17b are surrounded by and in contact with a protection layer 18b of a die 120b.

Figure 3A:
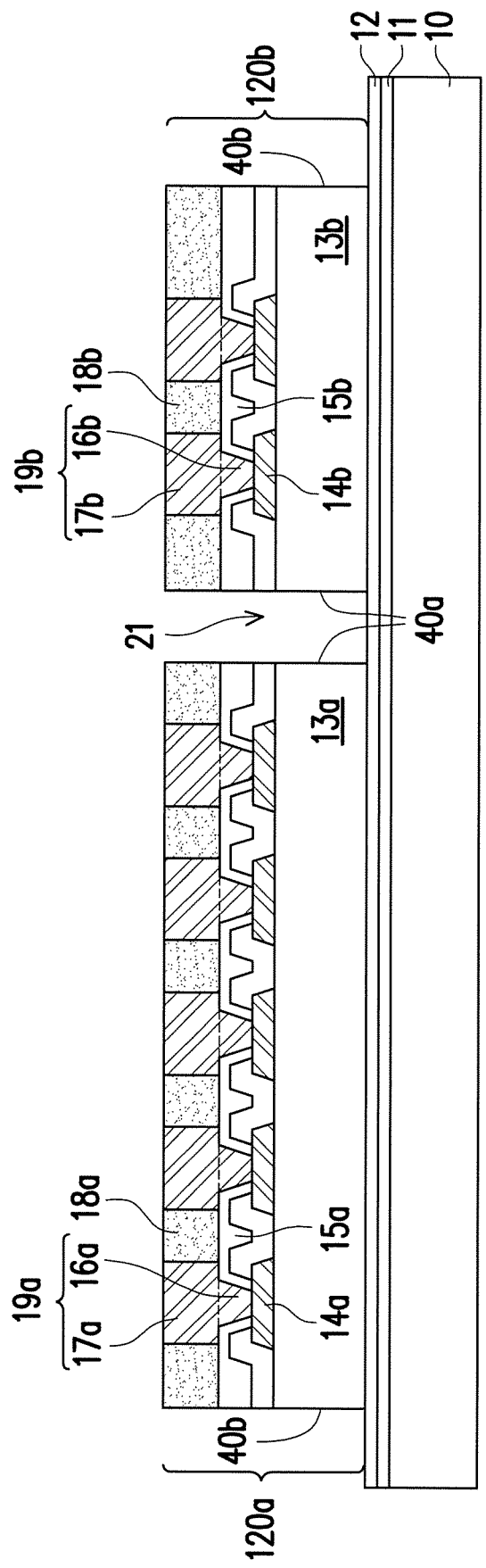
FIG. 3A to FIG. 3F are schematic cross-sectional views illustrating a method of forming a package structure according to a third embodiment of the disclosure.

Referring to FIG. 3A, processes similar to those described in FIG. 1A are performed, a de-bonding layer 11 is formed on a carrier 10, a die 120a and a die 120b are attached to the de-bonding 11 through an adhesive layer 12. The structural characteristics of the die 120a are substantially the same as those of the die 120a in the first embodiment. The die 120b differs from the die 20b in that, the die 120 further includes a protection layer 18b. The protection layer 18b is formed on the passivation layer 15b, and aside the connectors 17b, surrounding and covering the sidewalls of the connectors 17b. In some embodiments, the top surface of the protection layer 18b and the top surfaces of the connectors 17b are substantially coplanar with each other. A gap 21 is existed between the die 120a and the die 120b.

Figure 3B:
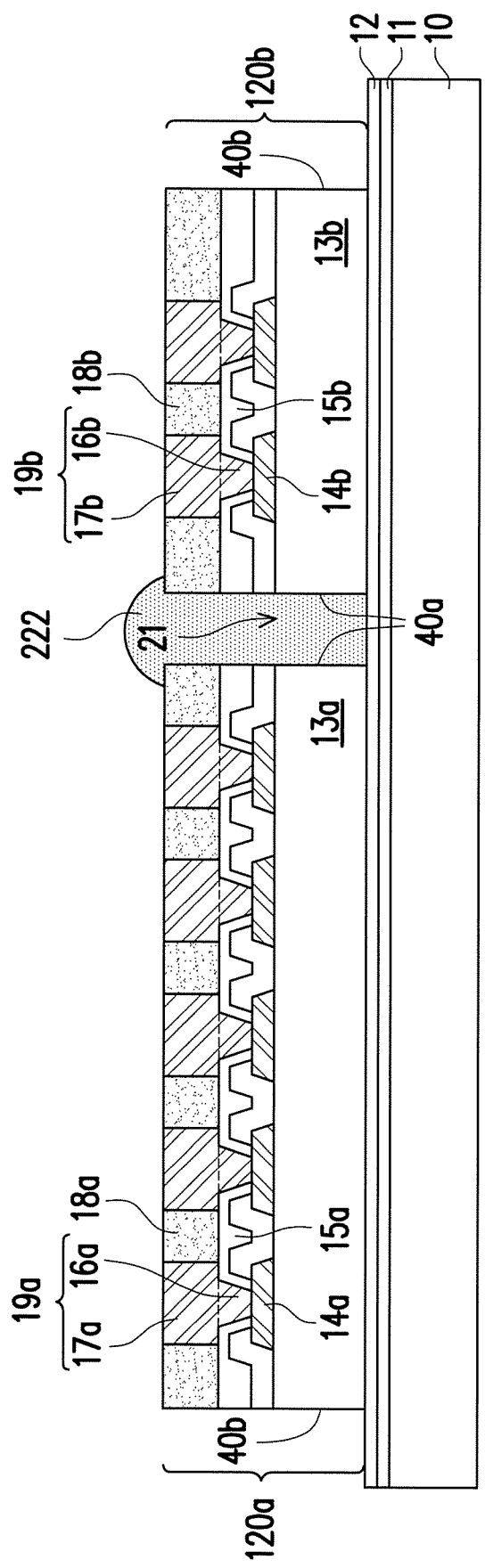
Figure 3C:
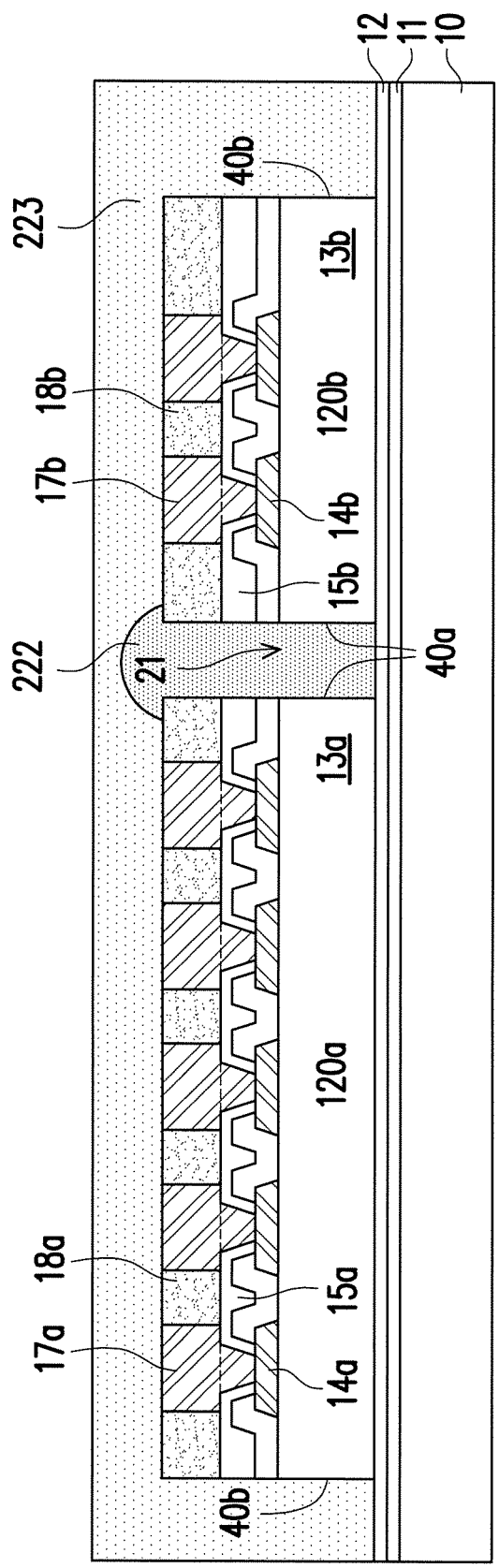

Referring to FIG. 3B and FIG. 3C, a first encapsulant material layer 222 is formed to fill the gap 21 between the die 120a and the die 120b. The first encapsulant material layer 222 at least encapsulates the first sidewalls 40a of the dies 120a and 120b. In some embodiments, the first encapsulant material layer 222 may protrudes from the top surfaces of the dies 120a and 120b. In some embodiments, the first encapsulant material layer 222 may further cover a portion of the top surface of the die 120a or/and a portion of the top surface of the die 120b.

A second encapsulant material layer 223 is formed on the carrier 10, the dies 120a and 120b, and the first encapsulant material layer 222. The materials and the forming methods of the first encapsulant material layer 222 and the second encapsulant material layer 223 are substantially the same as those of the first encapsulant material layer 22 and the second encapsulant material layer 23 described in the first embodiment, respectively.

Figure 3D:
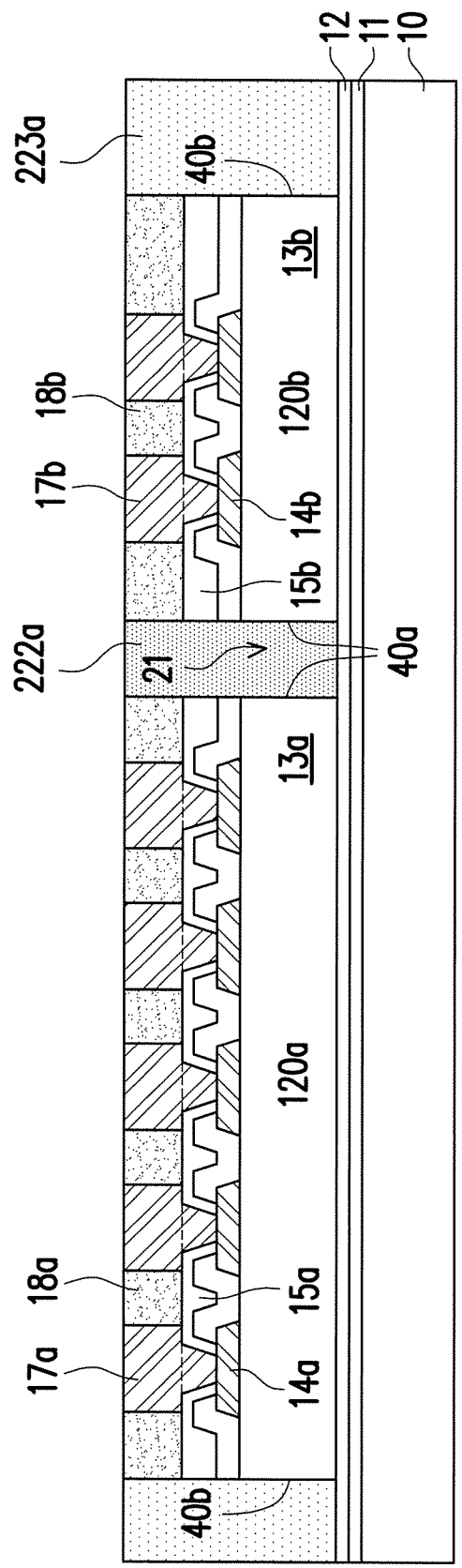

Referring to FIG. 3C and FIG. 3D, a planarization process is performed, and a portion of the first encapsulant material layer 222 and a portion of the second encapsulant material layer 223 are removed, such that the top surfaces of the connectors 17a and the connectors 17b are exposed, a first encapsulant 222a and a second encapsulant 223a are formed.

Figure 3E:
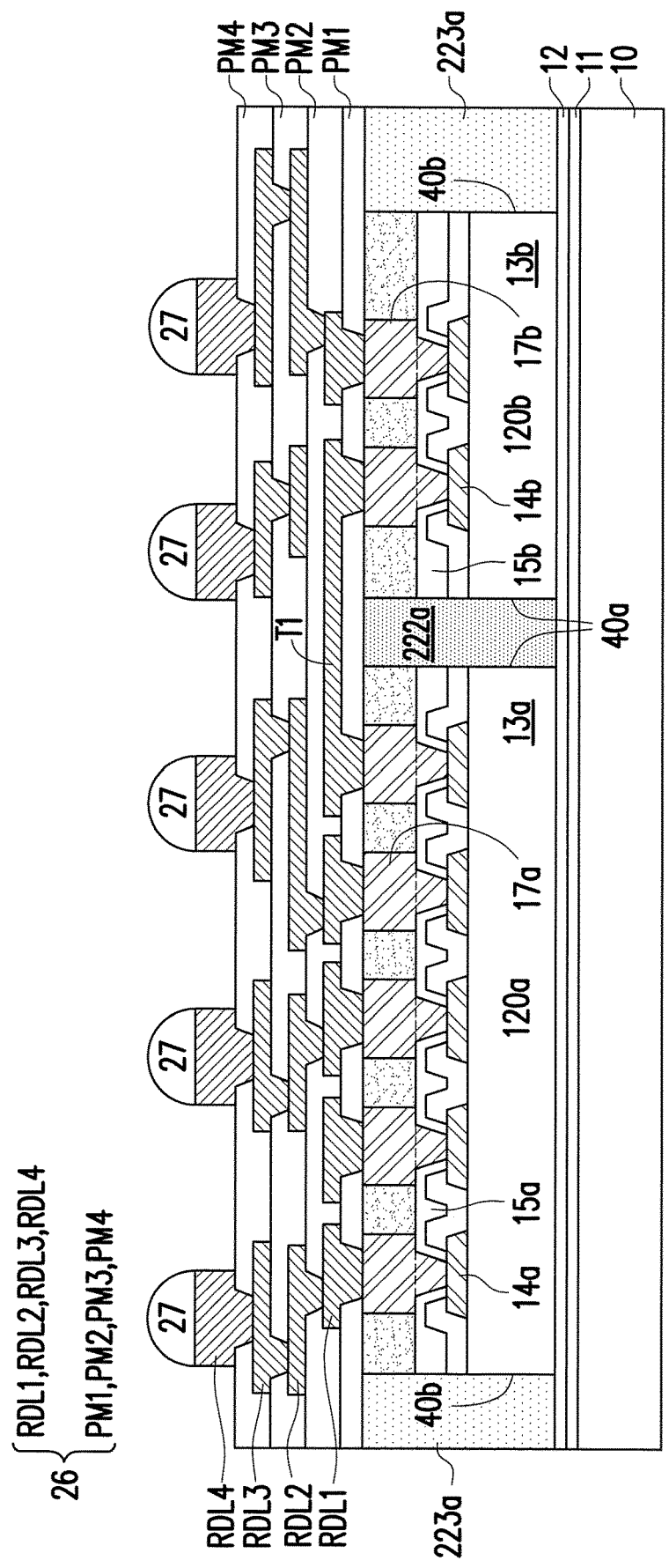
Figure 3F:
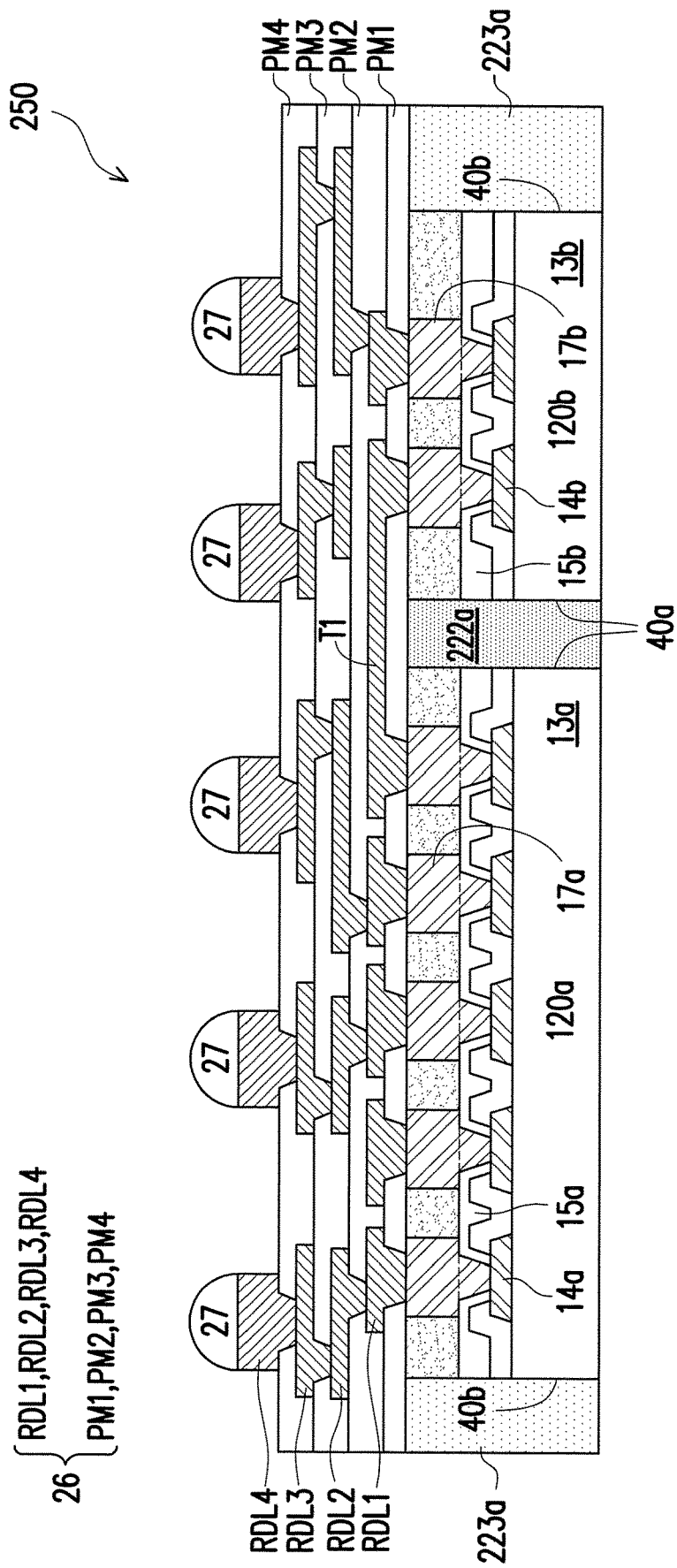

Referring to FIG. 3E and FIG. 3F, thereafter, a RDL structure 26 and a plurality of connectors 27 are formed on the dies 120a and 120b, the first encapsulant 222a and the second encapsulant 223a. The die 120a and the die 120b are electrically connected to each other through the RDL structure 26. The connectors 27 are electrically connected to the dies 120a and 120b through the RDL structure 26.

The de-bonding layer 11 is decomposed under the heat of light, and the carrier 10 is then released. In some embodiments, the adhesive layer 12 is removed. The bottom surfaces (or referred as back surfaces) of the dies 120a and 120b are exposed.

Referring to FIG. 3F, a package structure 250 is thus completed. The package structure 250 includes the two dies 120a and 120b, the first encapsulant 222a, the second encapsulant 223a, the RDL structure 26 and the connectors 27.

The first encapsulant 222a is located between the die 120a and the die 120b, that is, aside the first sidewalls 40a of the dies 120a and 120b, encapsulating and contacting with the first sidewalls 40a of the dies 120a and 120b. In some embodiments, the cross-section shape of the first encapsulant 222a includes I-shape, rectangle, square, or a combination thereof. The second encapsulant 223a is located aside, encapsulates and contacts with the second sidewalls 40b of the dies 120a and 120b. In this embodiment, the first encapsulant 222a and the second encapsulant 223a are not in contact with each other. The connectors 17a and 17b are not in contact with the first encapsulant 222a or the second encapsulant 223a, but are respectively surrounded by and in contact with the protection layers 18a and 18b. Interfaces are existed between the protection layer 18a/18b and the first encapsulant 222a or between the protection layer 18a/18b and the second encapsulant 223a, and the interfaces may be straight or inclined.

Thereafter, the package structure 250 may further be electrically coupled to other package components such as a printed circuit board (PCB), a flex PCB, or the like through the connectors 27.

Figure 6:
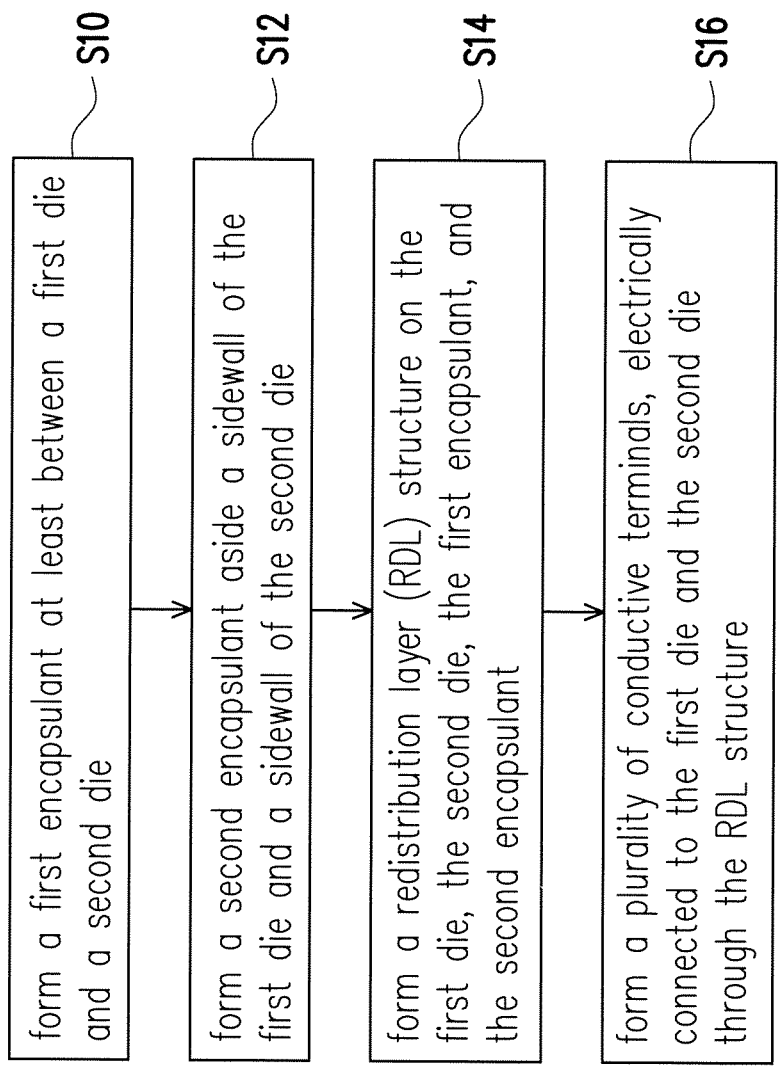
FIG. 6 is a flow chart illustrating a method of forming a package structure according to some embodiments of the disclosure.

FIG. 6 is a flow chart illustrating a method of forming a package structure according to some embodiments of the disclosure. Referring to FIG. 6, in step S10, a first encapsulant is formed at least between a first die and a second die. In step S12, a second encapsulant is formed aside a sidewall of the first die and a sidewall of the second die. In step S14, a redistribution layer (RDL) structure is formed on the first die, the second die, the first encapsulant, and the second encapsulant. In step S16, a plurality of conductive terminals are electrically connected to the first die and the second die through the RDL structure.

In the foregoing embodiments, package structure including two dies and method of manufacturing the same are illustrated. However, the disclosure is not limited thereto, the disclosure may also applied to single die package structure including one die or multiple die package structure including more than two dies.

In the embodiments of the disclosure, the encapsulant including a first encapsulant and a second encapsulant aside the dies are formed of two different materials by two step processes. The first encapsulant is formed at least aside the first sidewalls of the two dies, the second encapsulant is formed aside the second sidewalls of the two dies. The first encapsulant is formed of a material comprising fine fillers or no filler. Therefore, the problem of roughness surface or even pits may be caused by large filler are avoided. On the other hand, the first encapsulant is formed at least between the two dies, especially under the traces connecting the two dies. In other words, the traces of the bottommost redistribution layer are routing over the first encapsulant or/and the protection layer of the die in which no filler or fine filler is included. Therefore, the traces may achieve a fine quality, and the trace broken (open) and bridge (short) issues may occur due to the roughness of the encapsulant is avoided.

In accordance with some embodiments of the disclosure, a package structure is provided. The package structure includes a first die, a second die, a first encapsulant, a second encapsulant, and a plurality of conductive terminals. The first encapsulant is at least disposed between the first die and the second die, and on the second die. The second encapsulant is aside the first die and the second die. The conductive terminals are electrically connected to the first die and the second die through a redistribution layer (RDL) structure. An interface is existed between the first encapsulant and the second encapsulant.

In accordance with alternative embodiments of the disclosure, a package structure includes a first die, a second die, a first encapsulant, a second encapsulant, and a conductive terminal. The first encapsulant is between the first die and the second die, laterally encapsulating a sidewall of the first die and a sidewall of the second die. The second encapsulant is located aside and laterally encapsulating another sidewall of the first die and another sidewall of the second die. The conductive terminal is electrically connected to the first die and the second die through a redistribution layer (RDL) structure.

In accordance with some embodiments of the disclosure, a method of forming a package structure includes the following steps. A first encapsulant is formed at least between a first die and a second die. A second encapsulant is formed aside a sidewall of the first die and a sidewall of the second die. A redistribution layer (RDL) structure is formed on the first die, the second die, the first encapsulant, and the second encapsulant. A plurality of conductive terminals are electrically connected to the first die and the second die through the RDL structure.

The foregoing outlines features of several embodiments so that those skilled in the art may better understand the aspects of the disclosure. Those skilled in the art should appreciate that they may readily use the disclosure as a basis for designing or modifying other processes and structures for carrying out the same purposes and/or achieving the same advantages of the embodiments introduced herein. Those skilled in the art should also realize that such equivalent constructions do not depart from the spirit and scope of the disclosure, and that they may make various changes, substitutions, and alterations herein without departing from the spirit and scope of the disclosure.

What is claimed is:

1. A package structure, comprising:
   a first die and a second die, wherein the second die comprises a passivation layer and a connector protruding from the passivation layer;
   a first encapsulant, at least disposed between the first die and the second die, and on the second die;
   a second encapsulant, aside the first die and the second die, wherein the first encapsulant and the second encapsulant respectively comprise a filler, and the particle size of the filler of the first encapsulant is smaller than the particle size of the filler of the second encapsulant; and a plurality of conductive terminals, electrically connected to the first die and the second die through a redistribution layer (RDL) structure, wherein an interface is existed between the first encapsulant and the second encapsulant, wherein a topmost surface of the first encapsulant and a topmost surface of the second encapsulant are in physical contact with a bottom surface of the RDL structure, and the topmost surface of the first encapsulant is flatter than the topmost surface of the second encapsulant due to a smaller particle size of the filler of the first encapsulant, wherein the first encapsulant is tapered toward the RDL structure, wherein a top surface of the connector of the first die is in physical contact with a polymer layer of the RDL structure, wherein the interface between the first encapsulant and the second encapsulant is landing on a portion of a top surface of the passivation layer that is not covered by the first encapsulant and inclined toward the connector, and the top surface of the passivation layer is connected to a straight sidewall of the second die that is extending from the top surface of the passivation layer to a bottom surface of a substrate of the second die.

2. The package structure of claim 1, wherein the second encapsulant is not laterally between the first die and the second die, and is not overlapped with the first encapsulant between the first die and the second die in a direction perpendicular to the topmost surface of the first encapsulant.

3. The package structure of claim 1, wherein a portion of the second encapsulant is sandwiched between and in physical contact with the first encapsulant and the polymer layer of the RDL structure.

4. The package structure of claim 3, wherein the portion of the second encapsulant is overlapped with the first die in a direction perpendicular to the top surface of the first die.

5. The package structure of claim 1, wherein the first encapsulant is further disposed on the first die.

6. The package structure of claim 5, wherein the first encapsulant laterally encapsulates and contacts with a first connector of the first die, and a second connector of the second die.

7. The package structure of claim 1, wherein the second encapsulant is in contact with at least a sidewall of the first die.

8. The package structure of claim 1, wherein the second encapsulant is in contact with the straight sidewall of the second die.

9. The package structure of claim 8, wherein the second encapsulant further extends to contact the top surface of the passivation layer of the second die.

10. The package structure of claim 1, wherein a bottommost redistribution layer of the RDL structure comprises a trace, electrically connecting the first die and the second die, wherein the trace is located directly over the first encapsulant.

11. A package structure, comprising:
a first die and a second die, wherein the second die comprises a passivation layer and a connector protruding from the passivation layer;
a first encapsulant between the first die and the second die, laterally encapsulating a sidewall of the first die and a sidewall of the second die, wherein the first encapsulant further covers a top surface of the passivation layer and laterally encapsulating the connector of the second die;
a second encapsulant, located aside and laterally encapsulating another sidewall of the first die and another sidewall of the second die; and
a conductive terminal, electrically connected to the first die and the second die through a redistribution layer (RDL) structure,
wherein a topmost surface of the first encapsulant and a topmost surface of the second encapsulant, and topmost surfaces of the first die and the second die are in physical contact with a bottom surface of the RDL structure, and the topmost surface of the first encapsulant is flatter than the topmost surface of the second encapsulant due to the first encapsulant being free of filler and the second encapsulant comprising a filler;
wherein a portion of the first encapsulant between the first die and the second die is separated from the second encapsulant,
wherein an interface between the first encapsulant and the second encapsulant is landing on a portion of the top surface of the passivation layer that is not covered by the first encapsulant and arced toward the connector, and the top surface of the passivation layer is connected to a straight sidewall of the second die that is extending from the top surface of the passivation layer to a bottom surface of a substrate of the second die.

12. The package structure of claim 11, wherein a portion of the second encapsulant is sandwiched between and in physical contact with the first encapsulant and a polymer layer of the RDL structure.

13. The package structure of claim 11, wherein the second encapsulant further covers and physically contacts a top corner of the passivation layer of the second die, wherein the passivation layer has a planar topmost surface.

14. The package structure of claim 11, wherein a bottommost redistribution layer of the RDL structure comprises a trace, electrically connecting the first die and the second die, wherein the trace is located over the first encapsulant.

15. A method of manufacturing a package structure, comprising:
forming a first encapsulant at least between a first die and a second die, the first encapsulant laterally encapsulates a sidewall of the first die and a sidewall of the second die, wherein the second die comprises a passivation layer and a connector protruding from the passivation layer, and the first encapsulant further covers a top surface of the passivation layer and laterally encapsulating the connector of the second die;
forming a second encapsulant aside and laterally encapsulating another sidewall of the first die and another sidewall of the second die; and
forming a redistribution layer (RDL) structure on the first die, the second die, the first encapsulant, and the second encapsulant; and
forming a plurality of conductive terminals, electrically connected to the first die and the second die through the RDL structure,
wherein a topmost surface of the first encapsulant and a topmost surface of the second encapsulant, and topmost surfaces of the first die and second die are in physical contact with a bottom surface of the RDL structure, and the topmost surface of the first encapsulant is flatter than the topmost surface of the second encapsulant due to the first encapsulant being free of filler and the second encapsulant comprising a filler, wherein a portion of the first encapsulant between the first die and the second die is separated from the second encapsulant, wherein an interface between the first encapsulant and the second encapsulant is landing on a portion of the top surface of the passivation layer that is not covered by the first encapsulant and arced toward the connector, and the top surface of the passivation layer is connected to a straight sidewall of the second die that is extending from the top surface of the passivation layer to a bottom surface of a substrate of the second die.

16. The method of claim 15, wherein the first encapsulant and the second encapsulant are formed by different processes.

17. The method of claim 15, wherein forming the first encapsulant and the second encapsulant comprises:

forming a first encapsulant material on the first die and the second die by a dispensing process;

forming a second encapsulant material on the first encapsulant material and aside the first die and the second die; and performing a planarization process to remove portions of the first encapsulant material and the second encapsulant material, such that the first die and the second die are exposed.

18. The method of claim 15, wherein the first encapsulant is formed further to encapsulate and contact with the another sidewall of the second die, and to be disposed between the another sidewall of the second die and the second encapsulant.

19. The method of claim 15, wherein the first encapsulant is formed further on the first die to encapsulate and contact with sidewalls of a connector of the first die.

20. The method of claim 19, wherein the first encapsulant is formed further to encapsulate and contact with the another sidewall of the first die, and to be disposed between the another sidewall of the first die and the second encapsulant.

* * * * *